United States Patent
Hsieh et al.

(10) Patent No.: US 11,605,877 B2
(45) Date of Patent: Mar. 14, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Sheng-Chi Hsieh, Kaohsiung (TW); Chen-Chao Wang, Kaohsiung (TW); Teck-Chong Lee, Kaohsiung (TW); Chien-Hua Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 142 days.

(21) Appl. No.: 16/544,415

(22) Filed: Aug. 19, 2019

(65) Prior Publication Data
US 2020/0083591 A1    Mar. 12, 2020

Related U.S. Application Data

(60) Provisional application No. 62/728,718, filed on Sep. 7, 2018.

(51) Int. Cl.
*H01Q 1/22* (2006.01)
*H01L 23/498* (2006.01)
(Continued)

(52) U.S. Cl.
CPC ....... *H01Q 1/2283* (2013.01); *H01L 21/4857* (2013.01); *H01L 21/565* (2013.01);
(Continued)

(58) Field of Classification Search
CPC ....... H01L 2223/6677; H01L 23/49827; H01L 23/50; H01L 23/49816; H01L 24/25; H01L 24/83; H01L 24/92; H01L 24/16; H01L 2224/2518; H01L 2224/18; H01L 2224/83101; H01L 2224/92244; H01L 2224/83385; H01L 2224/16235; H01L 2224/73204; H01L 2224/16225;
(Continued)

(56) References Cited

U.S. PATENT DOCUMENTS 9,172,131 B2   10/2015   Chen et al.
2015/0340765 A1*  11/2015   Dang ............... H01Q 21/0075
343/893

(Continued)

FOREIGN PATENT DOCUMENTS

CN        107437654 A    12/2017

*Primary Examiner* — Julio J Maldonado
*Assistant Examiner* — Stanetta D Isaac
(74) *Attorney, Agent, or Firm* — Foley & Lardner LLP

(57) ABSTRACT

A semiconductor device package includes a glass carrier, a package body, a first circuit layer and a first antenna layer. The glass carrier has a first surface and a second surface opposite to the first surface. The package body is disposed on the first surface of the glass carrier. The package body has an interconnection structure penetrating the package body. The first circuit layer is disposed on the package body. The first circuit layer has a redistribution layer (RDL) electrically connected to the interconnection structure of the package body. The first antenna layer is disposed on the second surface of the glass carrier.

20 Claims, 50 Drawing Sheets

(51) Int. Cl.
*H01L 23/00* (2006.01)
*H01L 23/66* (2006.01)
*H01L 23/31* (2006.01)
*H01L 23/552* (2006.01)
*H01L 21/56* (2006.01)
*H01L 21/48* (2006.01)
*H01L 23/538* (2006.01)
*H01Q 9/16* (2006.01)
*H01L 23/15* (2006.01)

(52) U.S. Cl.
CPC .......... *H01L 23/15* (2013.01); *H01L 23/3128* (2013.01); *H01L 23/49822* (2013.01); *H01L 23/49838* (2013.01); *H01L 23/5383* (2013.01); *H01L 23/5386* (2013.01); *H01L 23/5389* (2013.01); *H01L 23/552* (2013.01); *H01L 23/66* (2013.01); *H01L 24/19* (2013.01); *H01L 24/20* (2013.01); *H01Q 9/16* (2013.01); *H01L 24/32* (2013.01); *H01L 24/73* (2013.01); *H01L 2223/6616* (2013.01); *H01L 2223/6677* (2013.01); *H01L 2224/32225* (2013.01); *H01L 2224/73267* (2013.01); *H01L 2924/3025* (2013.01)

(58) Field of Classification Search
CPC .......... H01L 2924/15153; H01L 2924/00014; H01Q 9/0414; H01Q 25/001; H01Q 3/40; H01Q 9/20; H01Q 21/10; H01Q 21/293; H01Q 21/30; H01Q 21/065; H01Q 1/38; H01Q 21/00
See application file for complete search history.

(56) References Cited

U.S. PATENT DOCUMENTS

2017/0346185 A1  11/2017  Wang et al.
2018/0191052 A1  7/2018   Ndip et al.
2018/0247905 A1* 8/2018   Yu .......................... H01L 21/78

* cited by examiner

SEMICONDUCTOR DEVICE PACKAGE AND METHOD OF MANUFACTURING THE SAME

CROSS-REFERENCE TO RELATED APPLICATIONS

This application claims the benefit of and priority to U.S. Provisional Application No. 62/728,718, filed Sep. 7, 2018, the contents of which are incorporated herein by reference in their entirety.

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is commonly used in an AiP system. However, due to the process constraint of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes a glass carrier, a package body, a first circuit layer and a first antenna layer. The glass carrier has a first surface and a second surface opposite to the first surface. The package body is disposed on the first surface of the glass carrier. The package body has an interconnection structure penetrating the package body. The first circuit layer is disposed on the package body. The first circuit layer has a redistribution layer (RDL) electrically connected to the interconnection structure of the package body. The first antenna layer is disposed on the second surface of the glass carrier.

In accordance with some embodiments of the present disclosure, a semiconductor device package includes a glass carrier, a first circuit layer, a first package body and a first antenna layer. The glass carrier has a first surface and a second surface opposite to the first surface. The first circuit layer is disposed on the first surface of the glass carrier. The first circuit layer has a redistribution layer (RDL). The first package body is disposed on the first circuit layer. The first package body has an interconnection structure penetrating the first package body and is electrically connected to the RDL. The first antenna layer is disposed on the second surface of the glass carrier.

In accordance with some embodiments of the present disclosure, a method of manufacturing a semiconductor device package includes (a) providing a glass carrier having a first surface and a second surface opposite to the first surface; (b) forming a circuit layer having a redistribution layer (RDL) on the first surface of the glass carrier; (c) disposing an electronic component on the circuit layer and electrically connected to the RDL of the circuit layer; and (d) forming a first package body on the circuit layer and covering the electronic component, the first package body having an interconnection structure penetrating the first package body and connected to the RDL of the circuit layer; and (e) forming a first antenna layer on the second surface of the glass carrier.

Figure 1A:
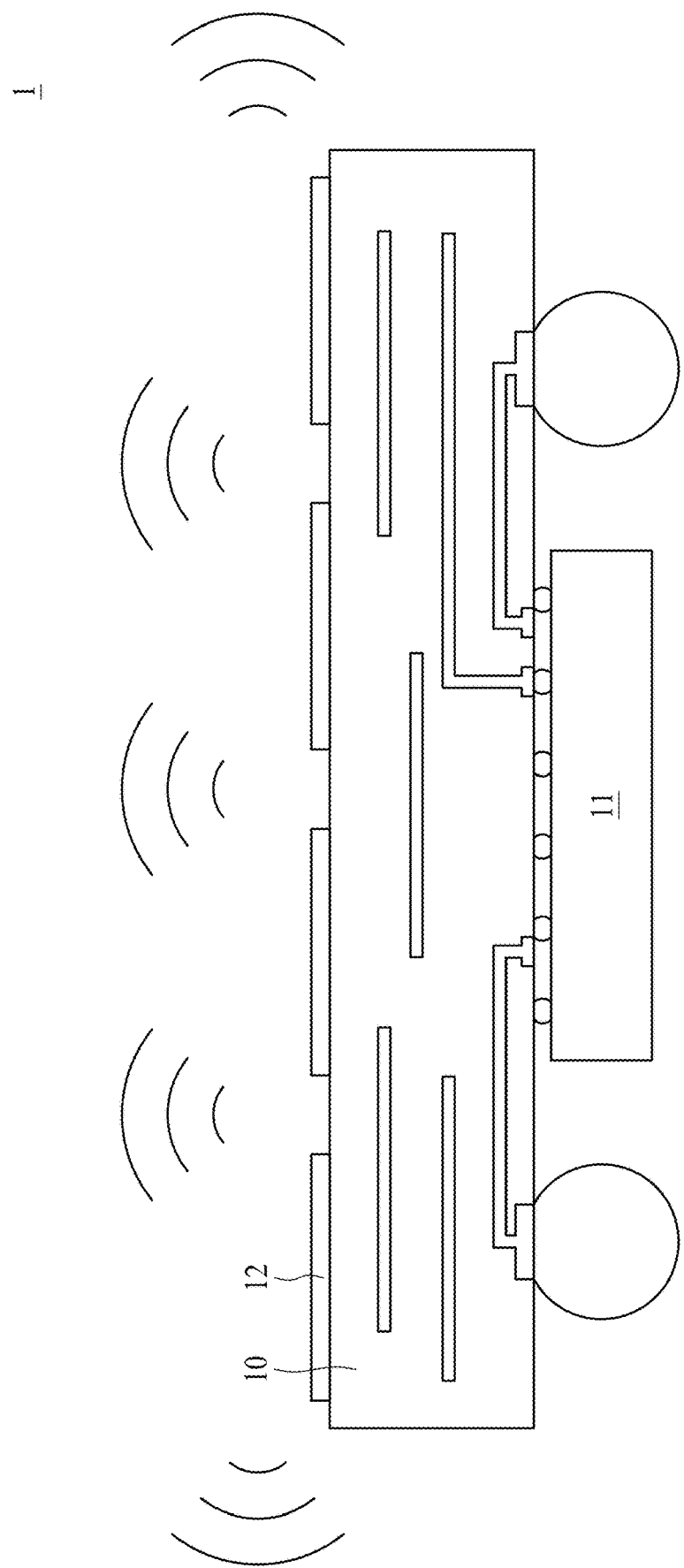
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

As technologies advance, various electronic components can be integrated into a package due to shrinkage of dimension of the electronic components. For example, an antenna used or operated in a band of frequencies clustered around 2.4 GHz has a size which is 12.5-fold the size of another antenna used or operated in a band of frequencies clustered around 28 GHz. For example, an antenna used or operated in a band of frequencies clustered around 2.4 GHz has a size which is 25-fold the size of another antenna used or operated in a band of frequencies clustered around 60 GHz.

A semiconductor device package, which includes an antenna or antenna structure, may also be referred to as an antenna-in-package (AiP) or antenna-on-package (AoP). For example, as shown in FIG. 1A, which illustrates a cross-sectional view of a semiconductor device package 1 in view of the some embodiments of the present disclosure, the semiconductor device package 1 is an example of an AiP/AoP. The semiconductor device package 1 includes a carrier 10, an electronic component 11 and an antenna 12 (or an antenna array including the antenna 12).

The electronic component 11 may include, for example but is not limited to, a radio frequency (RF) integrated circuit (IC). When the semiconductor device package 1 is operated in a band of frequencies clustered below around 5 GHz, a distance between the electronic component 11 and the antenna 12 may not affect performance of the semiconductor device package 1. However, loss in the transmission path (or path loss) may become severe as working frequency (or operation frequency) of the semiconductor device package 1 raises up. For example, path loss in a relatively high frequency band (e.g. a millimeter band (of spectrum between 30 gigahertz (GHz) and 300 GHz) in which millimeter wave is transmitted) is 10-fold the loss in a relatively low frequency band (e.g. frequencies clustered around 2.4 GHz). Accordingly, the antenna 12 and the electronic component 11 should be disposed as close as possible to mitigate the loss.

Figure 1B:
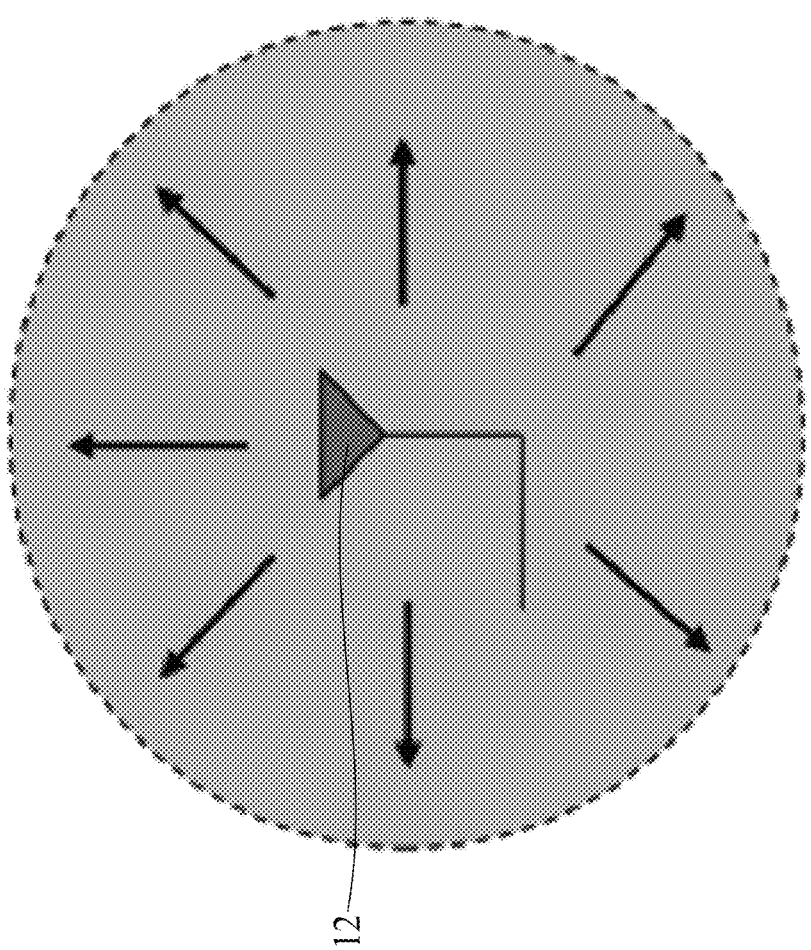
FIG. 1B illustrates a schematic diagram of an antenna in accordance with some embodiments of the present disclosure.

FIG. 1B illustrates a schematic diagram of the antenna 12 in accordance with some embodiments of the present disclosure. Each of the arrows represents a direction of signal transmission. The antenna 12 may also be referred to as an omnidirectional antenna. The antenna 12 is capable of transmitting and receiving radio signals equally in any direction in the horizontal plane. Area encircled by dotted line represents signal coverage. The antenna 12 may have a gain of around 1 dB to 2 dB.

Figure 1C:
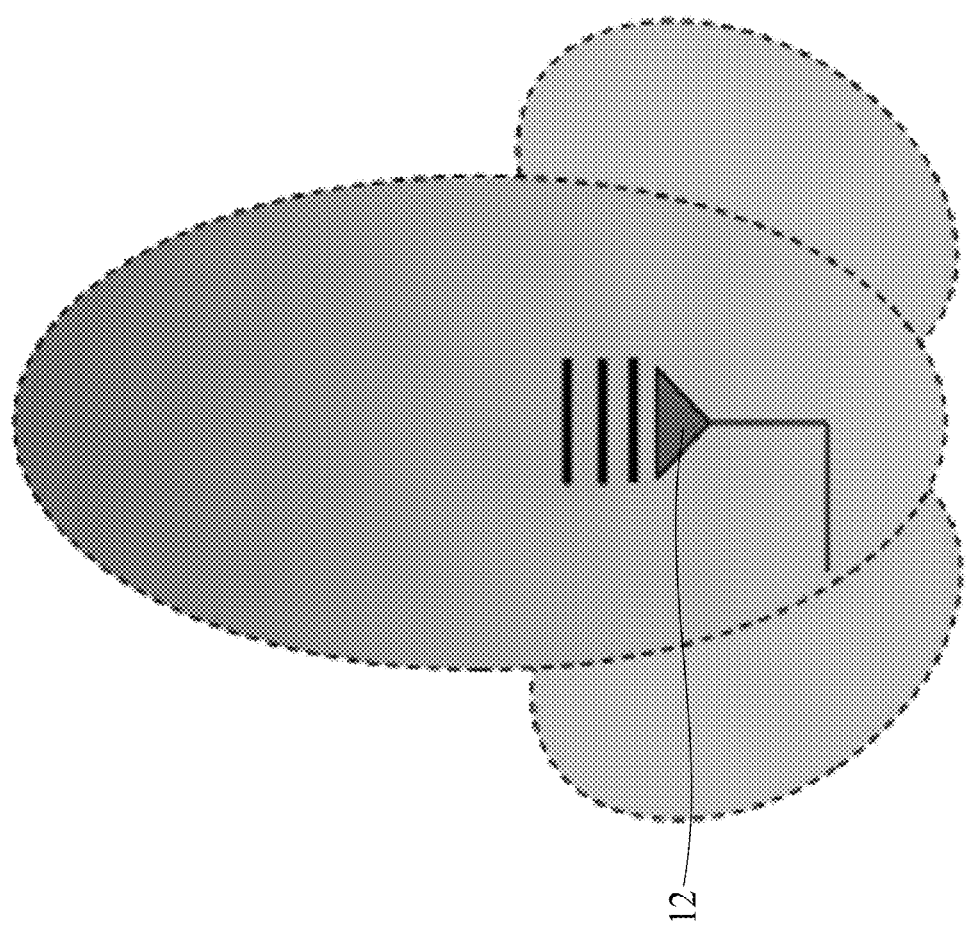
FIG. 1C illustrates a schematic diagram of an antenna in accordance with some embodiments of the present disclosure.
Figure 1D:
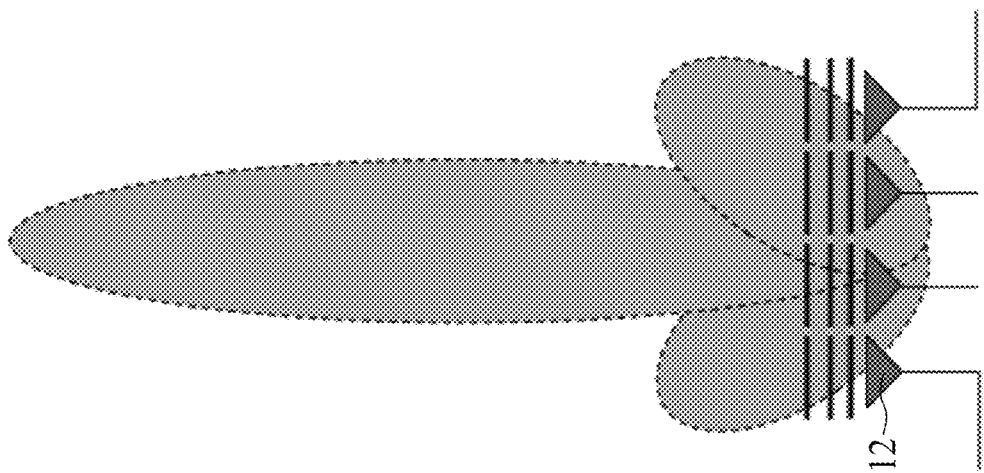
FIG. 1D illustrates a schematic diagram of an antenna array in accordance with some embodiments of the present disclosure.

FIG. 1C is a schematic diagram illustrating an example of the antenna 12 in accordance with other embodiment of the present disclosure. The antenna 12 may also be referred to as a directional antenna. The antenna 12 may include a millimeter-wave antenna. Area encircled by dotted line represents signal coverage. The antenna 12 may have a gain of around 7 dB to 8 dB. The antenna 12 may have a gain approximately 4-fold the gain of the aforesaid omnidirectional antenna FIG. 1D is a schematic diagram illustrating an example of an antenna array including the antenna 12 in accordance with some embodiments of the present disclosure. The antenna array s may include a millimeter-wave antenna. The antenna array may include an omnidirectional antenna. The antenna array may include a directional antenna. The antenna array may include an omnidirectional antenna and a directional antenna. Area encircled by dotted line represents signal coverage. The antenna array may have a gain of around 13 dB to 14 dB. The antenna array may have a gain approximately 16-fold the gain of the aforesaid omnidirectional antenna.

Figure 1E:
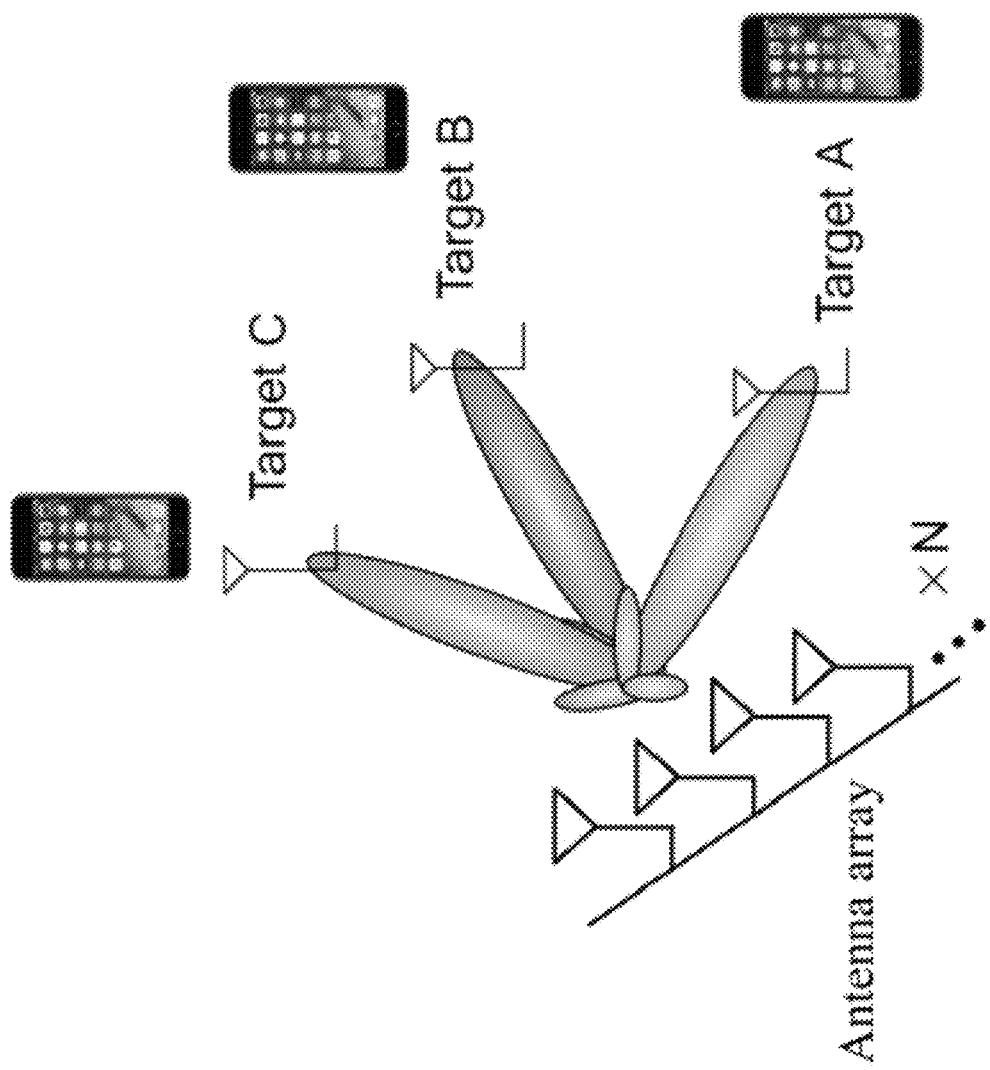
FIG. 1E illustrates a schematic diagram of a communication system in accordance with some embodiments of the present disclosure.

FIG. 1E is a schematic diagram illustrating an example of a communication system. The communication system includes an antenna array, target A, target B and target C. The communication system may include a beamforming system.

The antenna array illustrated in FIG. 1E may include a millimeter-wave antenna. The antenna array illustrated in FIG. 1E may include an antenna phase array. The antenna array illustrated in FIG. 1E may include an omnidirectional antenna. The antenna array illustrated in FIG. 1E may include a directional antenna. The antenna array illustrated in FIG. 1E may include an omnidirectional antenna and a directional antenna. The antenna array illustrated in FIG. 1E may include a switch-beam antenna for beamforming.

Figure 1F:
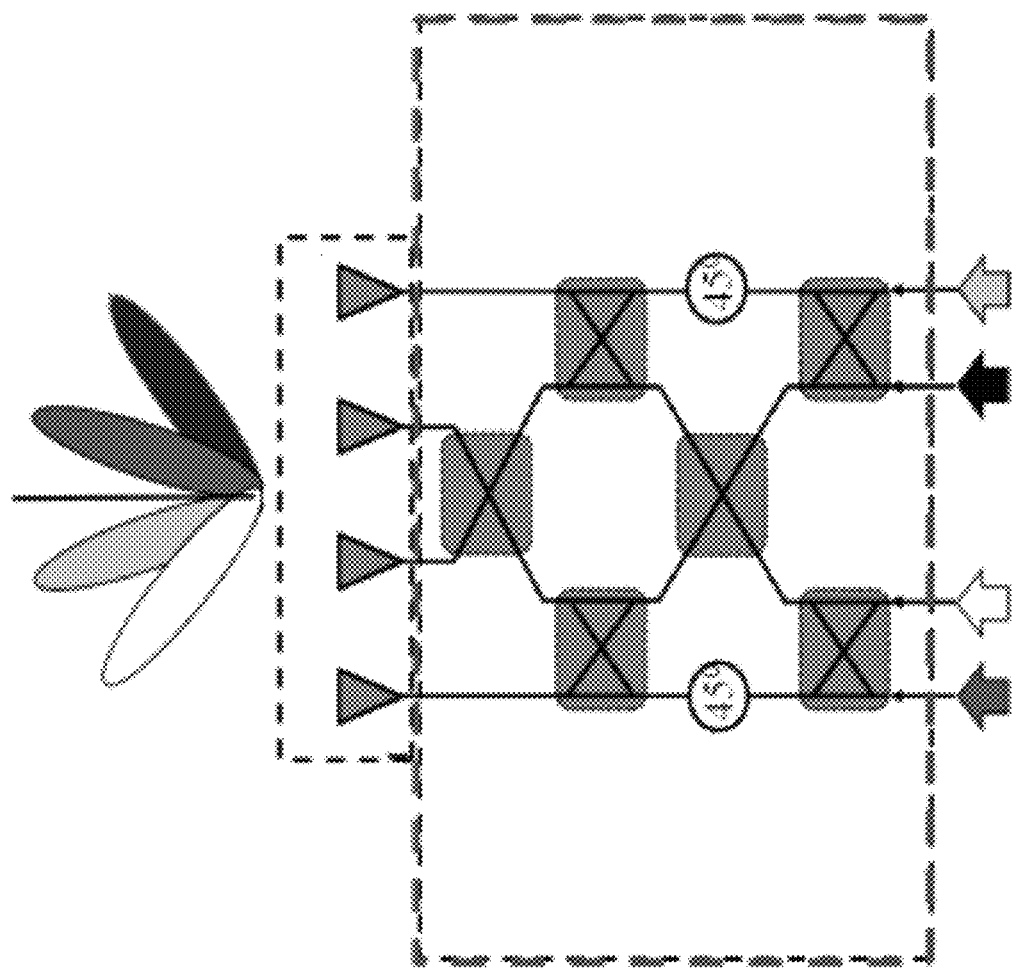
FIG. 1F illustrates a schematic diagram of an antenna array in accordance with some embodiments of the present disclosure.

FIG. 1F is a schematic diagram illustrating an example of an antenna array. The antenna array may include a phase array. Signals are transmitted or received with the help of the antenna array and the circuit in the dotted box. The circuit in the dotted box may include, for example but is not limited to, a phase shift circuit.

Figure 2:
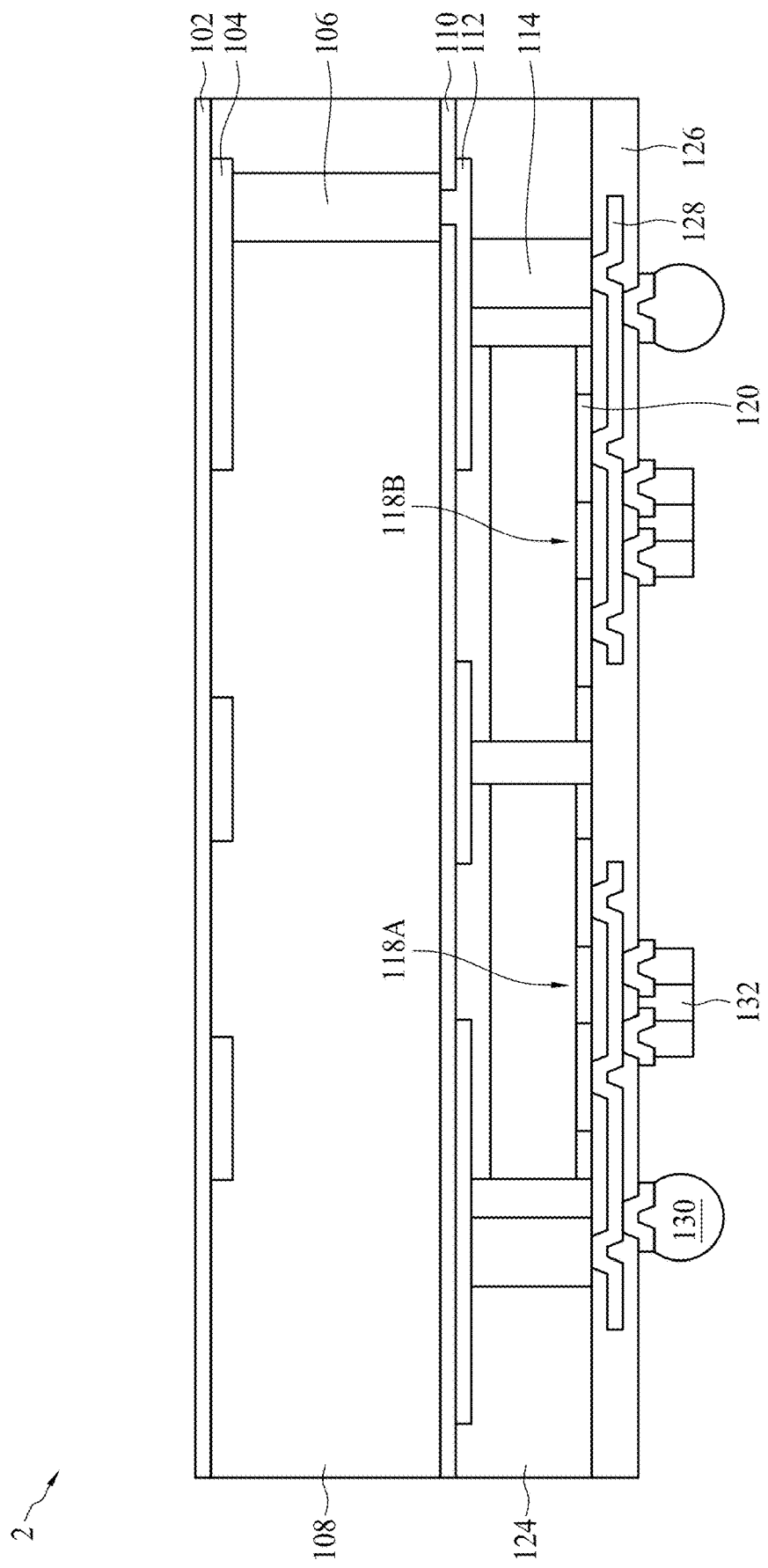
FIG. 2 illustrates a cross-sectional view of a semiconductor device package in accordance with some embodiments of the present disclosure.

FIG. 2 illustrates a semiconductor device package 2 in accordance with some embodiments of the present disclosure. The semiconductor device package 2 includes semiconductor devices 118A and 118B, protection layers 108 and 124, dielectric layers 110 and 126, a passivation layer 102, antenna elements 104, SMT devices 132, conductive elements 106, 112, 114, 120 and 128, and connection elements 130.

FIG. 3A, FIG. 3B, FIG. 3C, FIG. 3D, FIG. 3E, FIG. 3F, FIG. 3G, FIG. 3H and FIG. 3I show operations of manufacturing a semiconductor device package in accordance with some embodiments of the present disclosure.

Figure 3A:
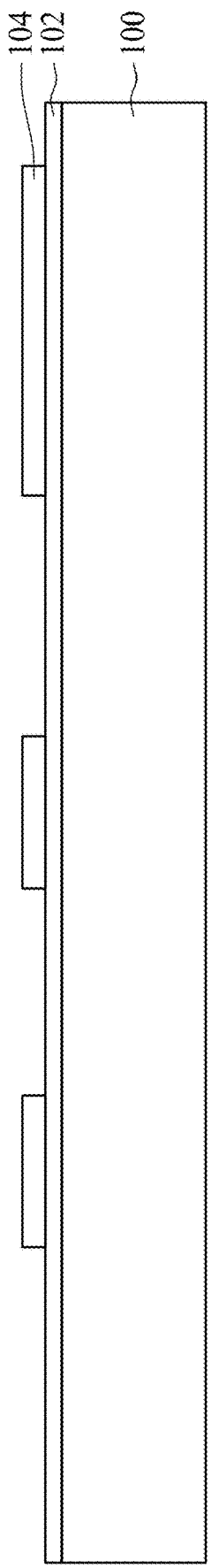
FIG. 3A, FIG. 3B, FIG. 3C, FIG. 3D, FIG. 3E, FIG. 3F, FIG. 3G, FIG. 3H and FIG. 3I illustrate a semiconductor manufacturing method in accordance with some embodiments of the present disclosure.

Referring to FIG. 3A, a passivation layer 102 is formed over a support carrier 100. Antenna elements 104 are formed over the passivation layer 102.

Figure 3B:
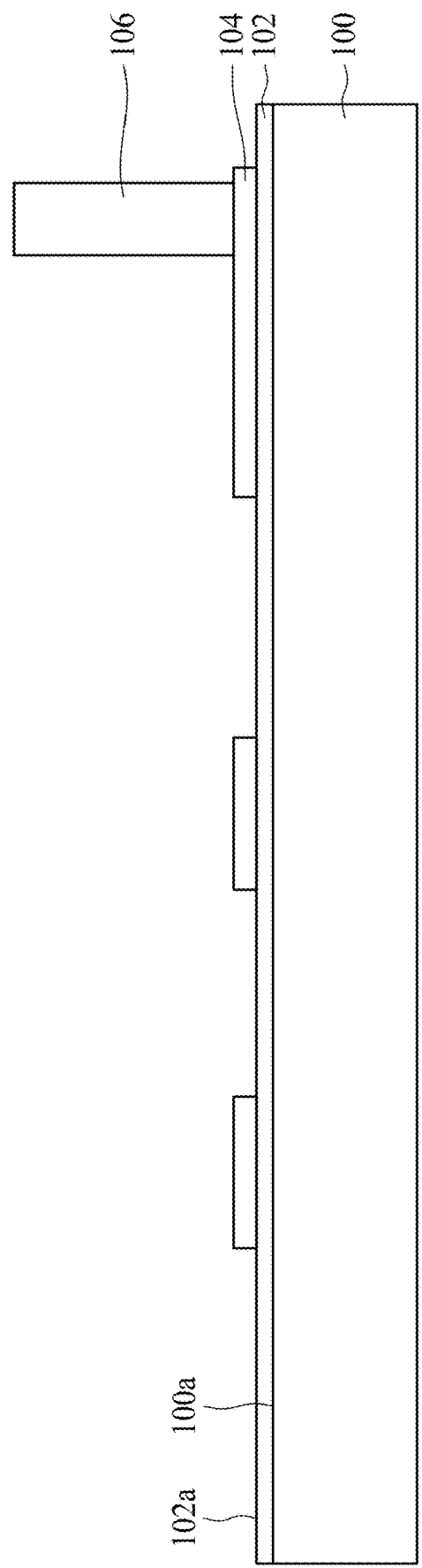

Referring to FIG. 3B, conductive elements 106 are formed over the antenna elements 104.

Figure 3C:
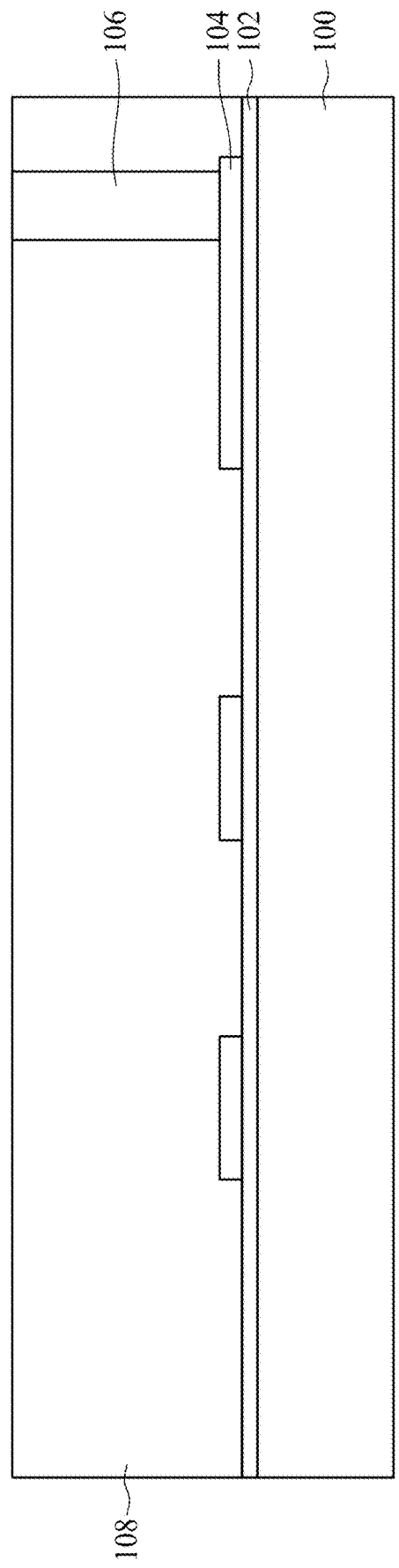

Referring to FIG. 3C, a protective layer 108 is formed over the structure shown in FIG. 3B to surround the antenna elements 104 and the conductive elements 106. The protective layer 108 is made of or includes a molding compound material. The molding compound material may include an epoxy-based resin with fillers dispersed therein. The fillers may include insulating fibers, insulating particles, other suitable elements, or a combination thereof. For example, the fillers include or are made of silicon oxide, silicon nitride, silicon carbide, carbon-containing polymer materials, other suitable materials, or a combination thereof. In some embodiments, the protective layer 108 is formed using a transfer molding process, a compression process, an immersion process, another applicable process, or a combination thereof.

In some embodiments, a planarization process is used to thin down the protective layer 108 until the conductive elements 106 are exposed. The planarization process may include a grinding process, a chemical mechanical polishing (CMP) process, an etching process, another applicable process, or a combination thereof. In some other embodiments, the planarization process is not performed. For example, the protective layer 108 is formed using a transfer molding process. By using the transfer molding process, the top surfaces of the conductive features 106 are not covered by the protective layer 108 during the formation of the protective layer 108. Therefore, it may be not necessary to perform a planarization process to expose the conductive elements 106.

Figure 3D:
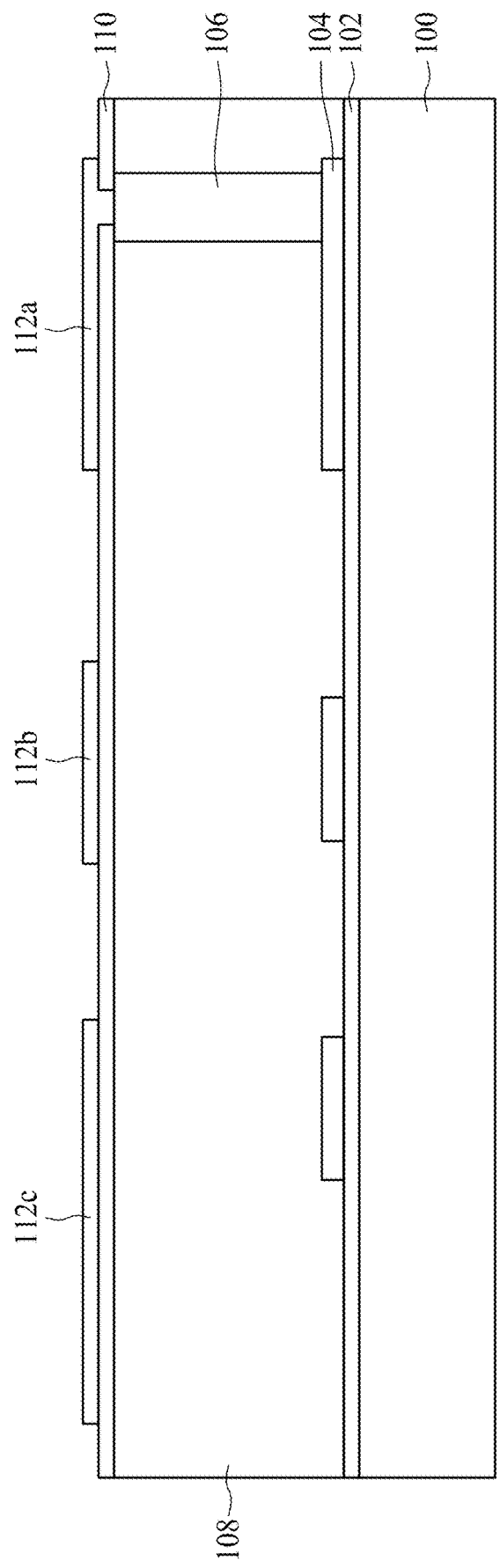

Referring to FIG. 3D, a dielectric layer 110 is deposited over the protective layer 108 and the conductive elements 106. Afterwards, conductive elements including conductive elements 112a, 112b, and 112c are formed over the dielectric layer 110. The protection layer 108, which is opaque, may cause misalignment issue. For example, conductive elements 112a, 112b, and 112c and the antenna elements 104 may be misaligned.

Figure 3E:
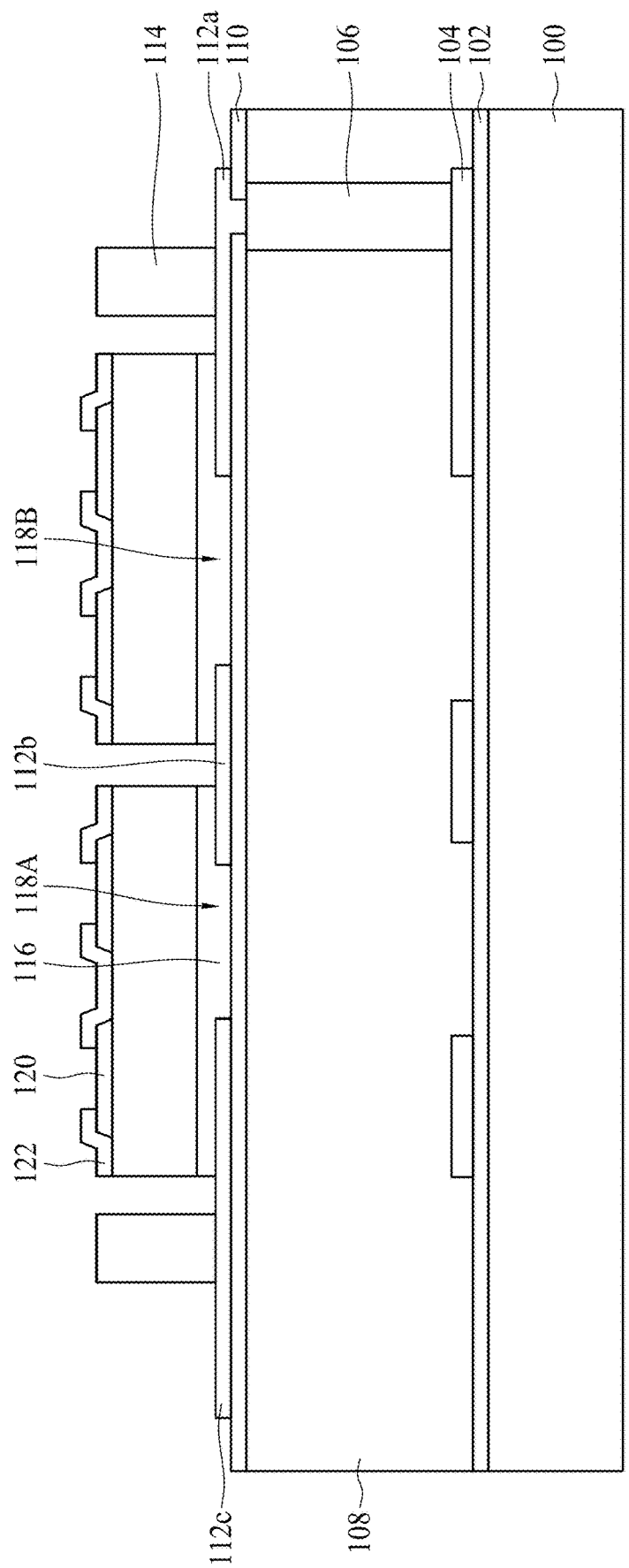

Referring to FIG. 3E, the conductive element 114 are formed over the conductive elements 112 and semiconductor dies 118A and 118B are placed over the conductive elements 112a, 112b, and/or 112c and the dielectric layer 110. An adhesive film 116 is used to affix the semiconductor dies 118A and 118B on the conductive elements 112a, 112b, and/or 112c.

Figure 3F:
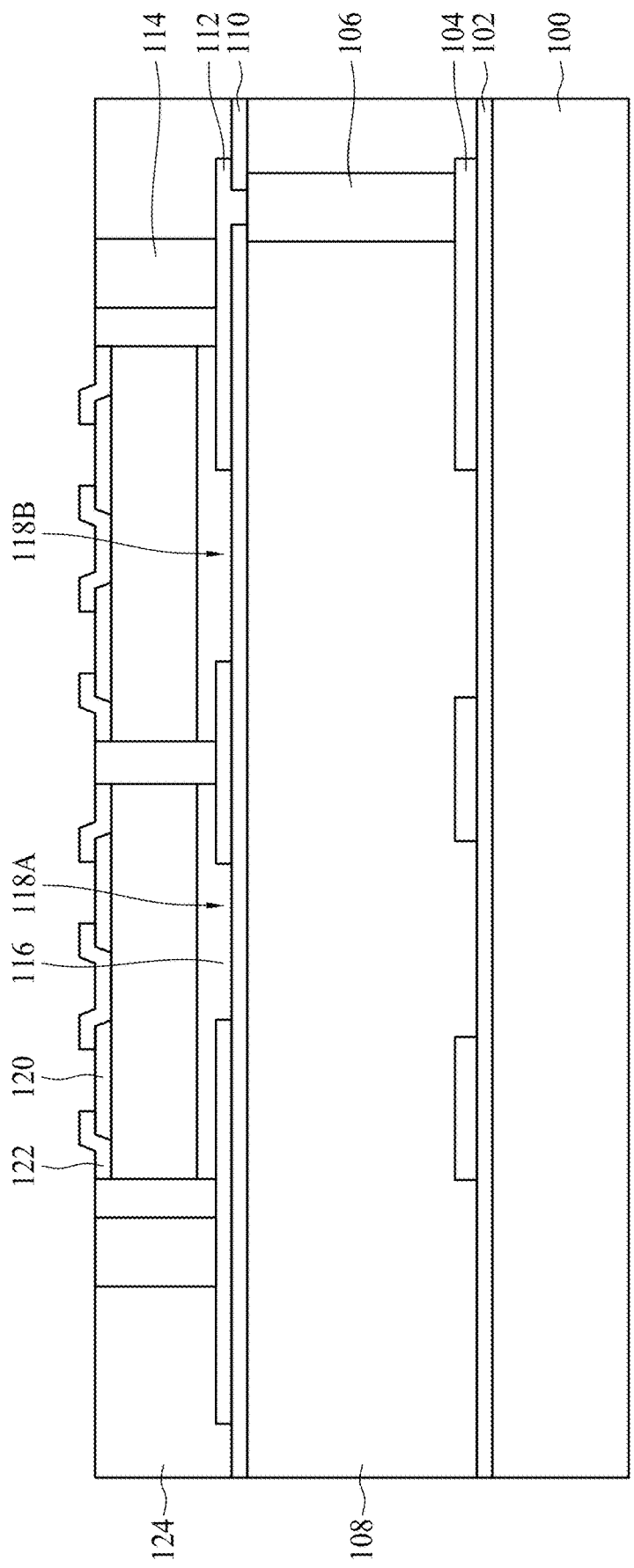

Referring to FIG. 3F, a protective layer 124 is formed over the structure shown in FIG. 3E. The protective layer 124 surrounds the conductive elements 114 and the semiconductor dies 118A and 118B. In some embodiments, the protective layer 124 is made of or includes a molding compound material. The molding compound material may include an epoxy-based resin with fillers dispersed therein. In some embodiments, the protective layer 124 is formed using a transfer molding process, a compression process, an immersion process, another applicable technique, or a combination thereof. The protective layer 124 includes a material having a dielectric constant (Dk) greater than 3. The protective layer 124 includes a material having a loss tangent or dissipation factor (Df) greater than 0.01. The loss tangent or Df may become worse as working frequency grows relatively high.

In some embodiments, a planarization process is used to thin down the protective layer 124 until the conductive features 114 and the conductive elements 120 of the semiconductor dies 118A and 118B are exposed. The planarization process may include a grinding process, a CMP process, an etching process, another applicable process, or a combination thereof. In some other embodiments, the planarization process is not performed. For example, the protective layer 124 is formed using a transfer molding process where the top surfaces of the conductive elements 114 and the conductive elements 120 of the semiconductor dies 118A and 118B are not covered by the protective layer 124.

Forming the protection layer 108 and the protection layer 124 in different stages may take relatively long time, which may adversely affect yield rate of the semiconductor device package.

The protection layer 108 and the protection layer 124, which have a relative great volume as compared to other elements/components (e.g. semiconductor dies 118A and 118B, antenna elements 104, conductive elements 106, 112, 114, etc.), may cause warpage issues.

Figure 3G:
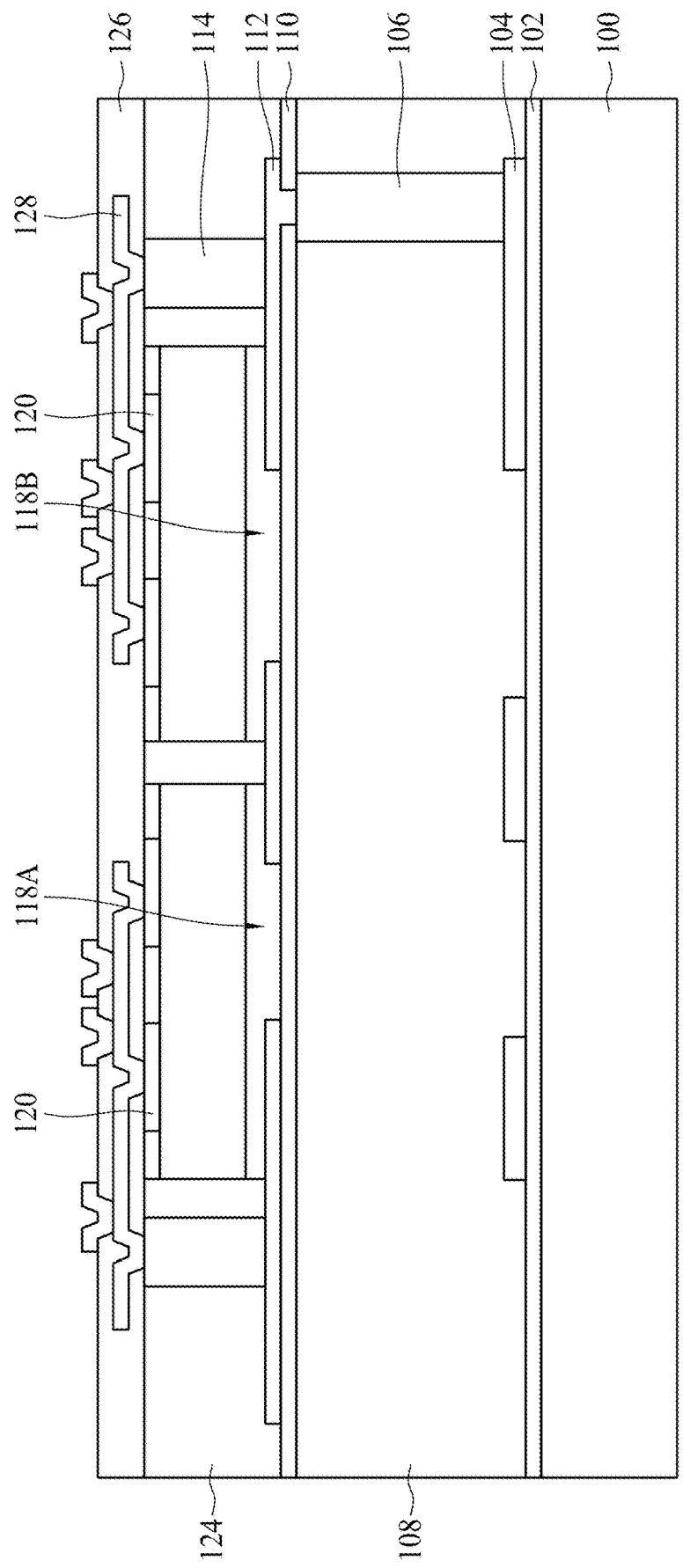

Referring to FIG. 3G, an interconnection structure is formed over the structure shown in FIG. 3F. The interconnection structure includes multiple dielectric layers 126 and multiple conductive elements 128.

Figure 3H:
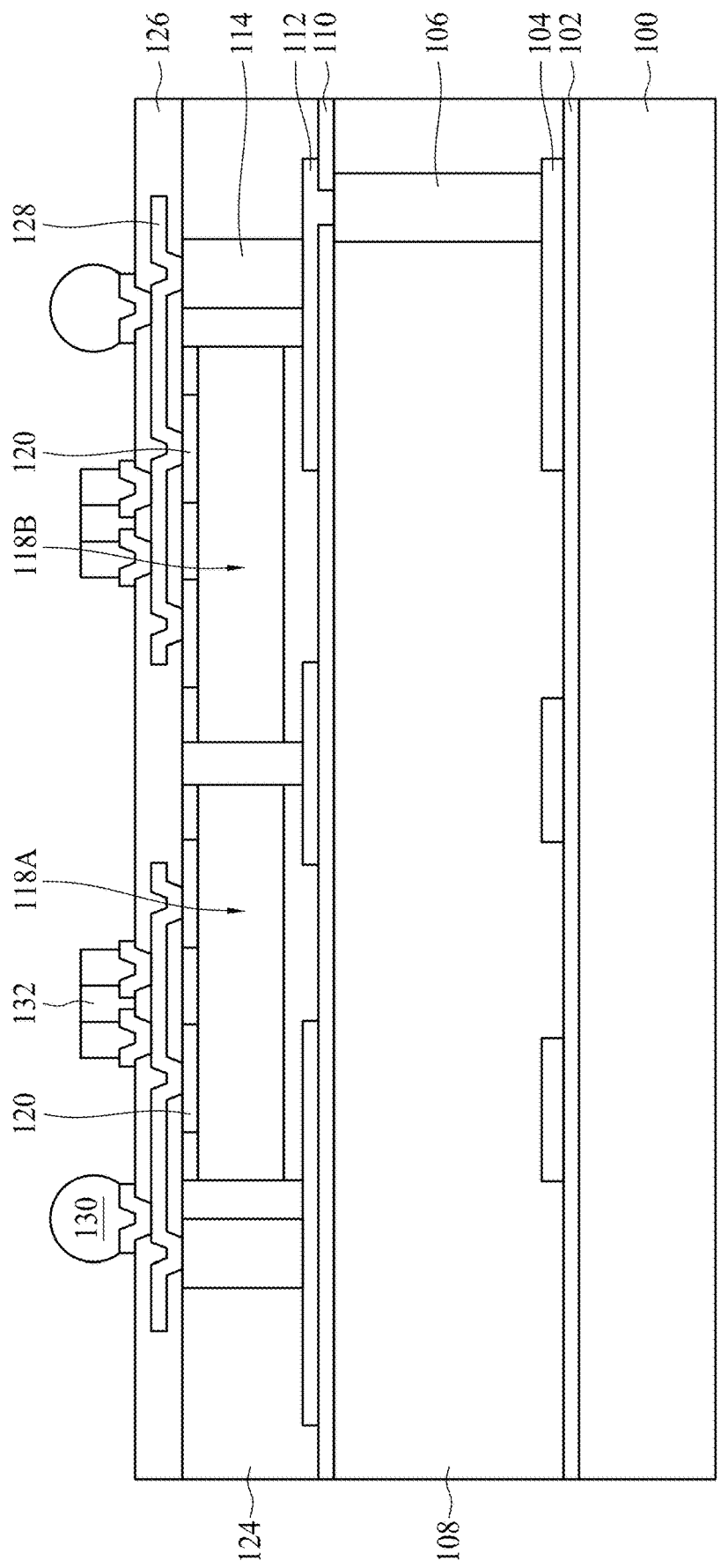

Referring to FIG. 3H, connection elements 130 are formed over some of the conductive elements 128. In some embodiments, the conductive elements 130 include solder bumps. The solder bumps are made of tin and other metal materials. The conductive elements 130 may include metal pillars such as copper pillars in some embodiments. Afterwards, surface mounting devices 132 are placed on some of the conductive elements 128, as shown in FIG. 3H in accordance with some embodiments. The surface mounting devices 132 may include passive devices, such as capacitors, resistors, and/or inductors.

Figure 3I:
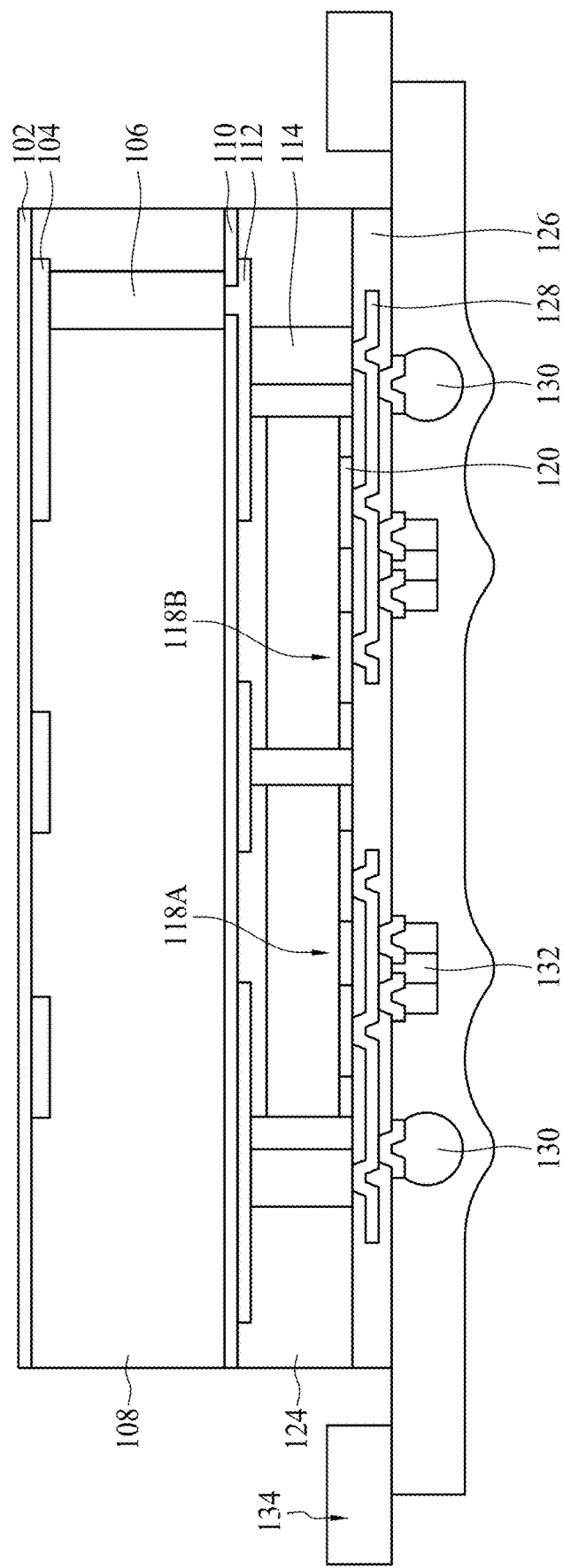

Referring to FIG. 3I, the structure shown in FIG. 3H is placed upside down and disposed on a tape frame 134 or carrier 134. Afterwards, the support carrier 100 is removed. In some embodiments, a dicing operation is performed to obtain multiple semiconductor packages.

Afterwards, the tape frame 134 or carrier 134 is removed, as shown in FIG. 2 in accordance with some embodiments, where one of the semiconductor device packages is shown.

Figure 4:
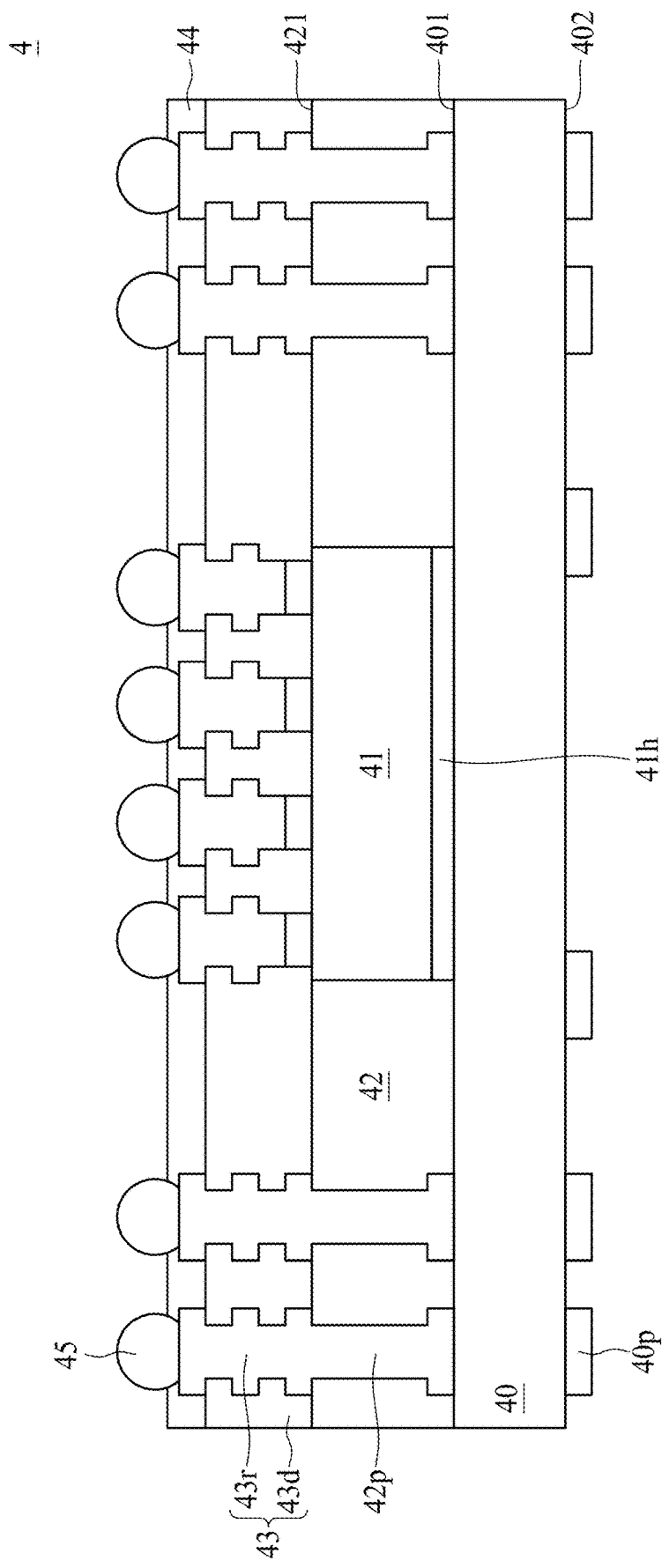
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 includes a carrier 40, an electronic component 41, a package body 42, a circuit layer 43, a protection layer 44 and electrical contacts 45.

In some embodiments, the carrier 40 may be or include a glass substrate. The carrier 40 may include conductive pad(s), trace(s), and interconnection(s) (e.g. via(s)). In some embodiments, the carrier 40 may include transparent material. In some embodiments, the carrier 40 may include opaque material. The carrier 40 includes a material having a Dk less than approximately 3.5. The carrier 40 includes a material having a Dk less than approximately 3. The carrier 40 includes a material having a loss tangent or dissipation factor (Df) less than approximately 0.005. The carrier 40 includes a material having a Df less than approximately 0.003. The carrier 40 has a surface 401 and a surface 402 opposite to the surface 401. Compared to the organic substrate, it is easier to control the thickness of a glass carrier, which can facilitate the miniaturization of the semiconductor device package 4. In some embodiments, the thickness of the carrier 40 is about 400 μm.

A conductive layer 40p is disposed on the surface 402 of the carrier 40. In some embodiments, the conductive layer 40p defines a patterned antenna, such as a directional antenna, an omnidirectional antenna, an antenna array. For example, the conductive layer 40p defines a patch antenna. The conductive layer 40p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The electronic component 41 is disposed on the surface 401 of the carrier 40. The electronic component 41 may be an active electronic component, such as an integrated circuit (IC) chip or a die. The electronic component 41 has a backside surface bonded or attached to the surface 401 of the carrier by an adhesion element 41h. The adhesion element 41h includes gel, die attach film (DAF) or the like.

One or more interconnection structure 42p (e.g., conductive pillars or conductive elements) are disposed on the surface 401 of the carrier 40. The interconnection structure 42p is, or includes, a conductive material such as a metal or metal alloy. Examples of the conductive material include Au, Ag, Cu, Pt, Pd, or an alloy thereof.

The package body 42 is disposed on the surface 401 of the carrier 40. The package body 42 covers the electronic component 41 and exposes an active surface of the electronic component 41. For example, a surface 421 of the package body is substantially coplanar with the active surface of the electronic component 41. The package body 42 covers a portion of the interconnect structure 42p and expose another portion (e.g., top portion) of the interconnection structure 42p for electrical connections. In some embodiments, the package body 42 includes an epoxy resin including fillers, a molding compound (e.g., an epoxy molding compound or other molding compound), a polyimide, a phenolic compound or material, a material including a silicone dispersed therein, or a combination thereof.

The circuit layer 43 is disposed on a surface 421 of the package body 42. The circuit layer 43 includes one or more interconnection layers (e.g., redistribution layers, RDLs) 43r and one or more dielectric layers 43d. A portion of the interconnection layer 43r is covered or encapsulated by the dielectric layer 43d while another portion of the interconnection layer 43r is exposed from the dielectric layer 43d to provide electrical connections. The exposed portion of the interconnection layer 43r is electrically connected to the interconnection structure 42p and the active surface of the electronic component 41.

In some embodiments, the dielectric layer 43d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of interconnection layers 43r depending on design specifications. In some embodiments, the interconnection layer 43r is formed of or includes Au, Ag, Cu, Pt, Pd, or an alloy thereof.

The protection layer 44 is disposed on the circuit layer 43 to cover a portion of the interconnection layer 43r exposed from the dielectric layer 43d and exposes another portion of the interconnection layer 43r exposed from the dielectric layer 43d for electrical connections. In some embodiments, the protection layer 44 may be or includes solder mask or other suitable materials.

The electrical contacts 45 are disposed on the interconnection layer 43r exposed from the protection layer 44. In some embodiments, the electrical contacts 45 may include solder or other suitable material(s).

Figure 5:
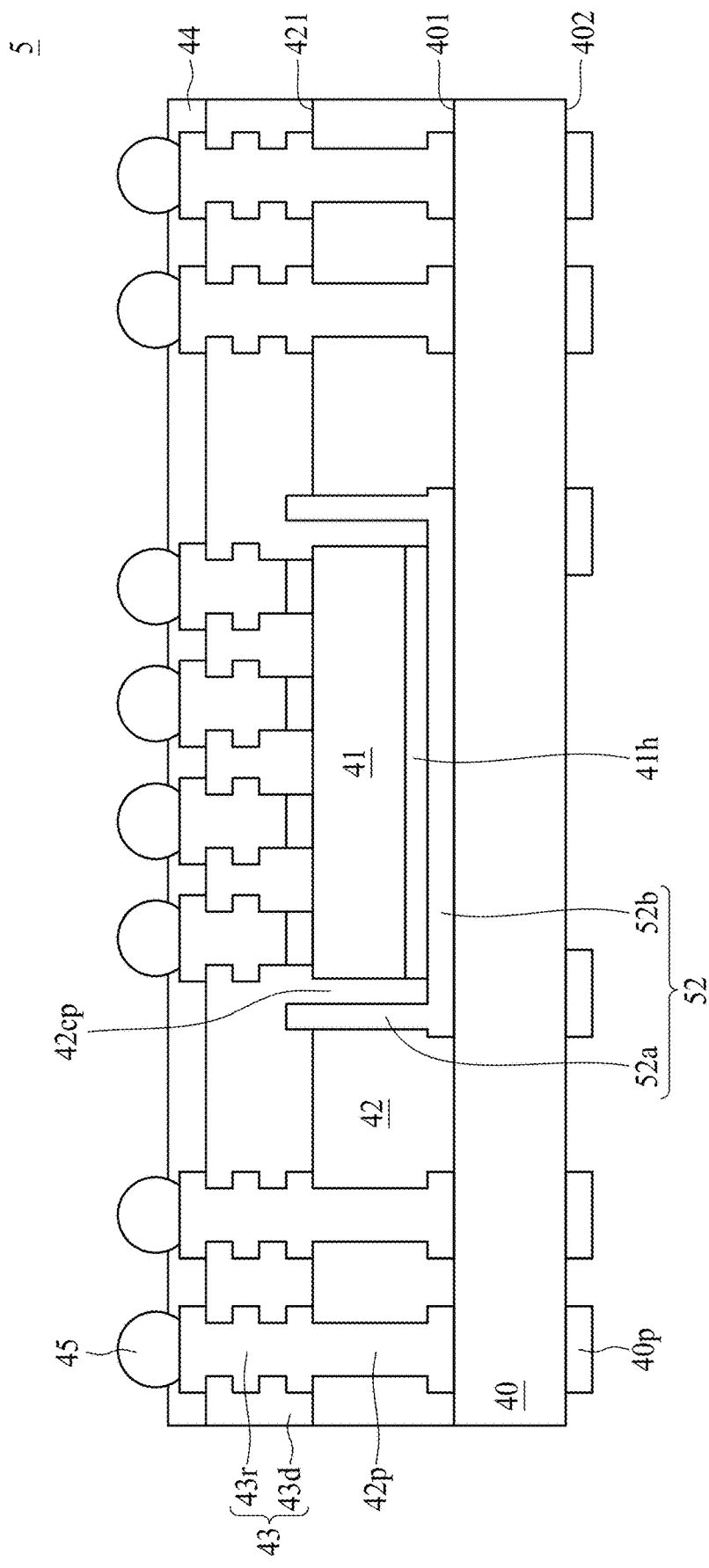
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 4 in FIG. 4, and the difference therebetween are described below.

The package body 42 has or defines a cavity 42c to expose the surface 401 of the carrier 40. A conductive element 52 has a first portion 52a disposed on a sidewall of the cavity 42c and a second portion 52b disposed on the surface 401 of the carrier 40 exposed from the package body 42. The electronic component 41 is disposed within the cavity 42c and on the portion 52b of the conductive element 52. The electronic component 41 is spaced apart from the portion 52a of the conductive element 52. For example, there is a gap between the portion 52a of the conductive element 52 and the electronic component 41. In some embodiments, the dielectric layer 43d is disposed within the gap between the portion 52a of the conductive element 52 and the electronic component 41. In some embodiments, the conductive element 52 may act as an electromagnetic interference (EMI) shield to protect the electronic component 41 from EMI. The conductive element 52 is formed of or includes Au, Ag, Cu, Pt, Pd, or an alloy thereof.

Figure 6A:
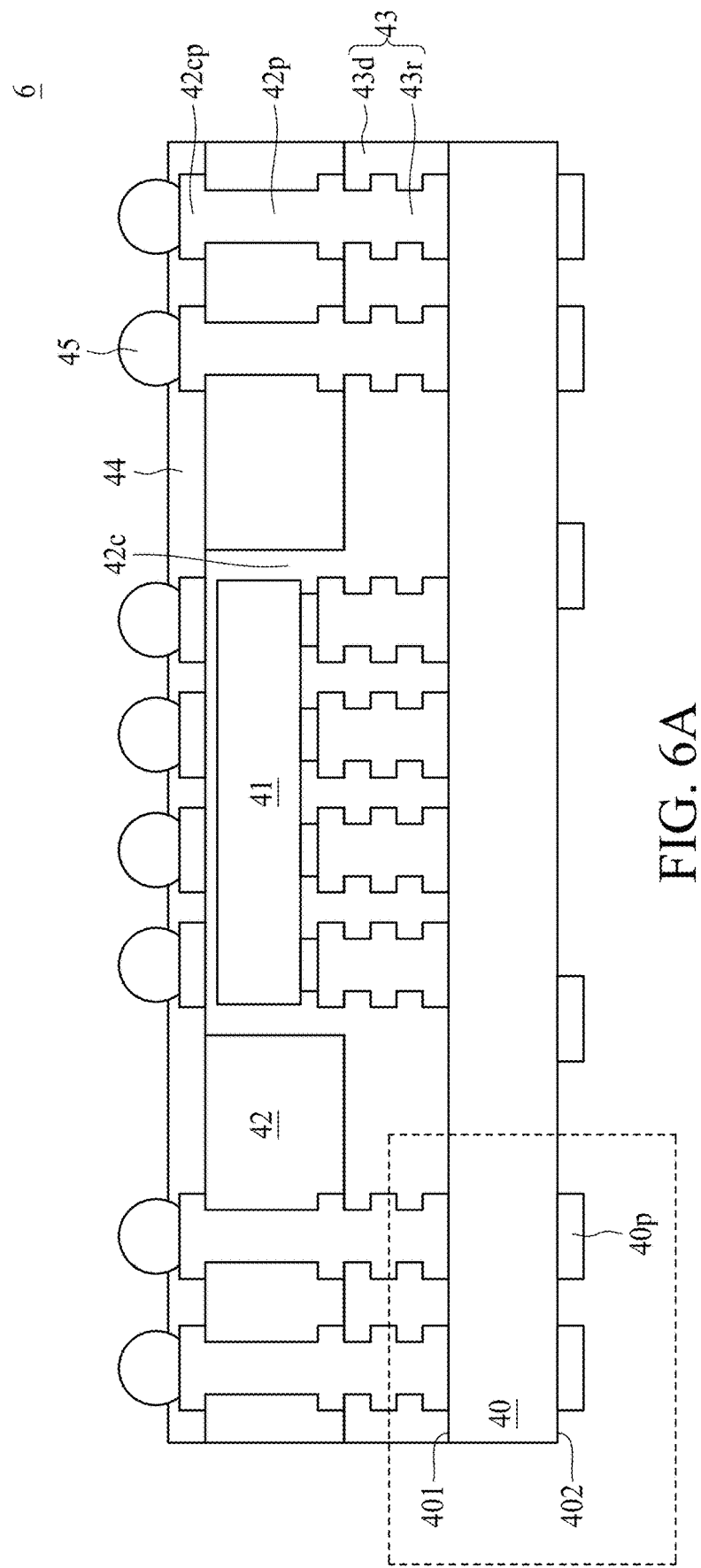
FIG. 6A illustrates a cross-sectional view of a semiconductor device package in accordance with some embodiments of the present disclosure.

FIG. 6A illustrates a cross-sectional view of a semiconductor device package 6 in accordance with some embodiments of the present disclosure. The semiconductor device package 6 is similar to the semiconductor device package 4 in FIG. 4, and the difference therebetween are described below.

The circuit layer 43 is disposed on the surface 401 of the carrier 40. In some embodiments, a portion of the interconnection layer 43r of the circuit layer 43 directly disposed on the surface 401 of the carrier 40 may define an antenna. The electronic component 41 is disposed on the circuit layer 43 and electrically connected to the interconnection layer 43r exposed from the dielectric layer 43d. The interconnection structure 42p is disposed on the circuit layer 43 and electrically connected to the interconnection layer 43r exposed from the dielectric layer 43d.

The package body 42 is disposed on the circuit layer 43. The package body 42 has or defines a cavity 42c to accommodate the electronic component 41. In some embodiments, the electronic component 41 is spaced apart from the sidewall of the cavity 42c. For example, there is a gap between the sidewall of the cavity 42c and the electronic component 41. In some embodiments, the dielectric layer 43d is disposed within the gap between the sidewall of the cavity 42c and the electronic component 41. The package body 42 covers a portion of the interconnection structure 42p and exposes another portion of the interconnection structure 42p for electrical connections. A conductive layer 42cp is disposed on the package body 42. A portion of the conductive layer 42cp is electrically connected to the exposed portion of the interconnection structure 42p.

Figure 6B:
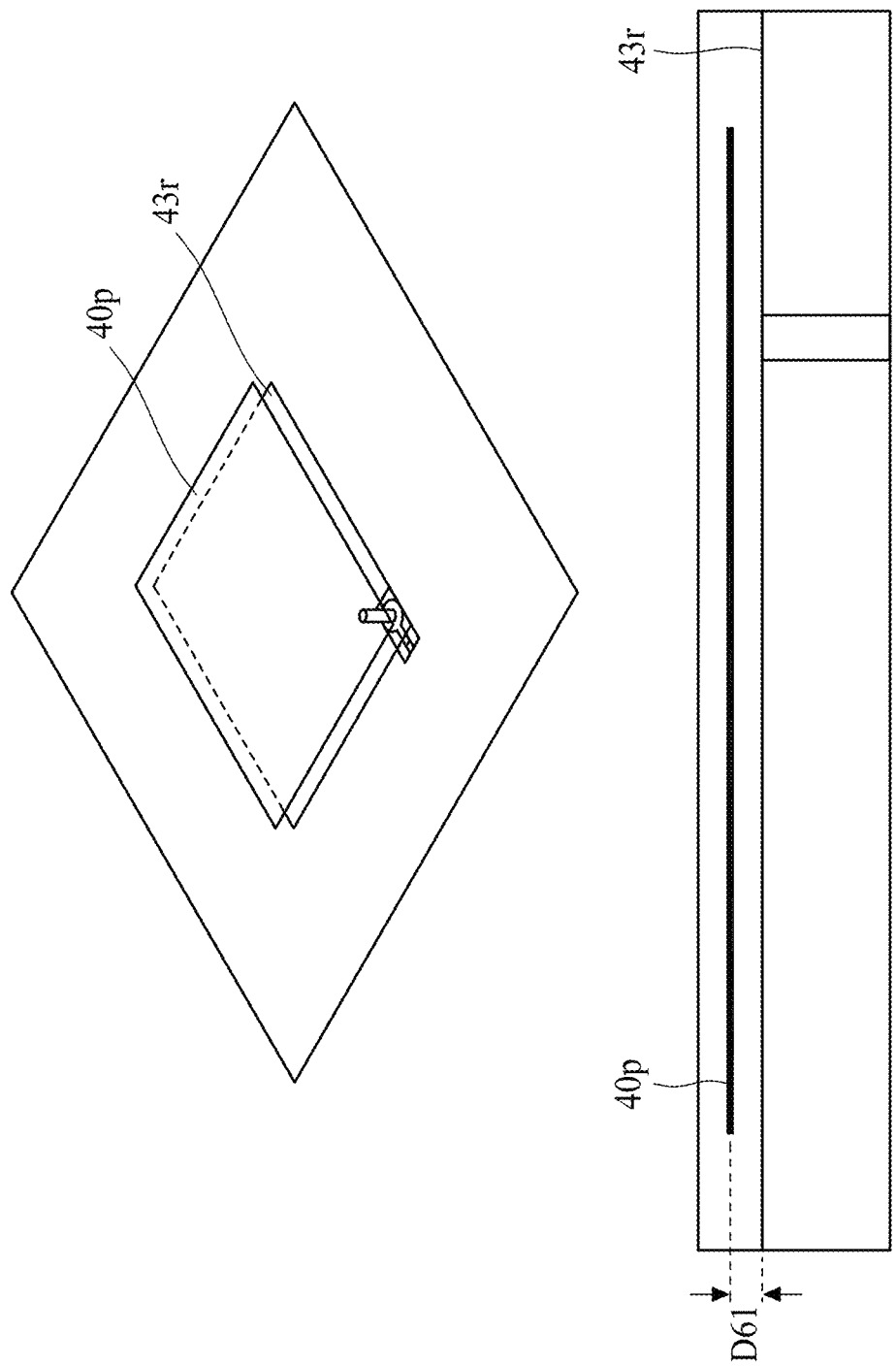
FIG. 6B illustrates an enlarged view of the structure encircled by the dotted line as shown in FIG. 6A in accordance with some embodiments of the present disclosure.

FIG. 6B is an enlarged view of the structure encircled by the dotted line as shown in FIG. 6A. The carrier 40 which spaces or separates the antenna elements (e.g., the conductive layer 40p) from the interconnection layers 43r (which may include a corresponding antenna pattern) may facilitate signal coupling. For example, in one condition that the carrier 40 spaces or separates the antenna elements (e.g., the conductive layer 40p) from the interconnection layers 43r (which may include a corresponding antenna pattern) by a distance D61 ranged from approximately 200 μm to approximately 400 μm, the working frequency of the semiconductor device package 6 may be expanded by an bandwidth ranged from approximately 3 GHz to approximately 6 GHz. A gain or an increase of bandwidth of the working frequency of the semiconductor device package 6 may be may be achieved by changing material of the carrier 40 (e.g. with a relatively low Dk material) or changing the coupling distance.

Figure 6C:
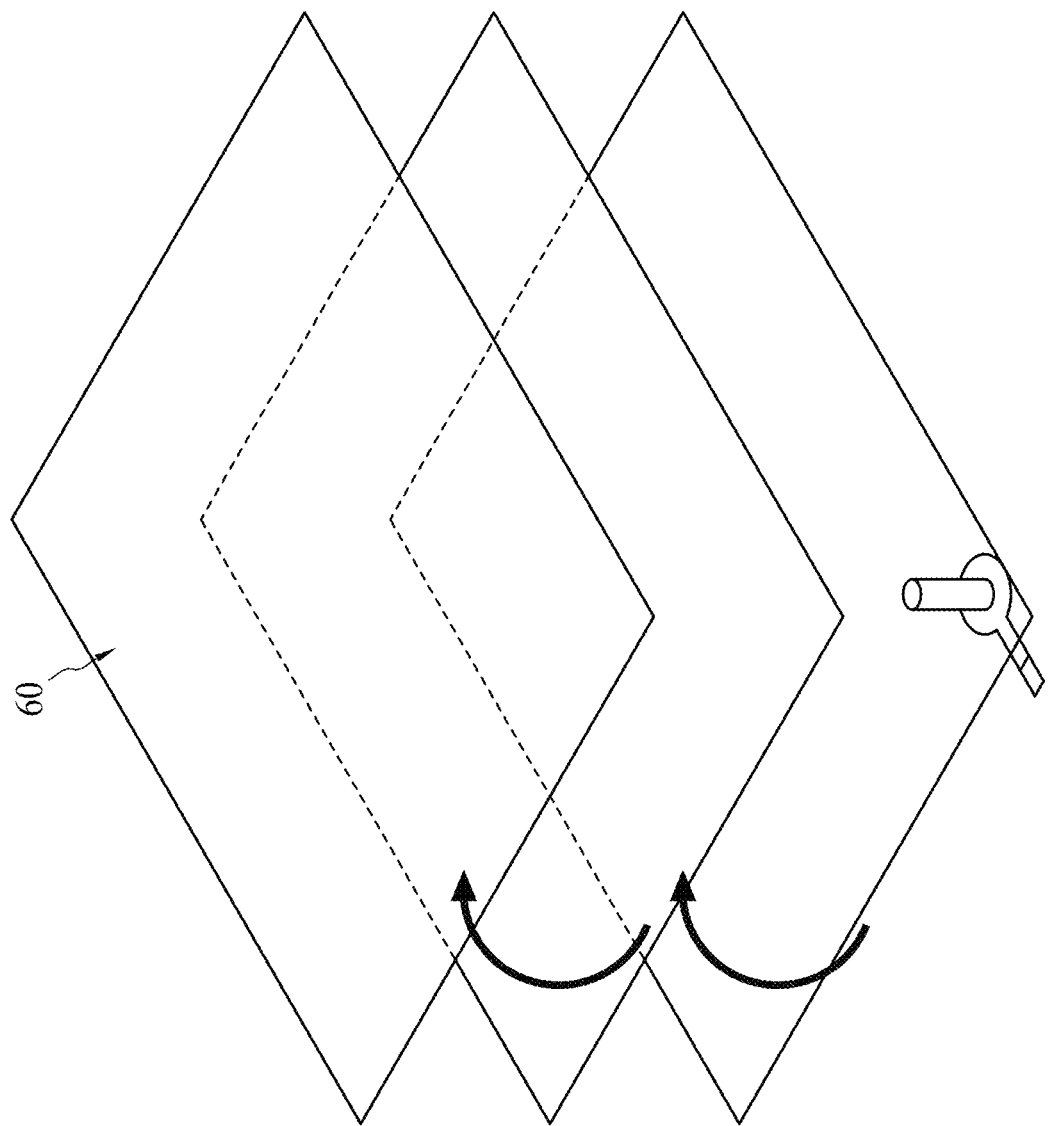
FIG. 6C illustrates a coupling structure of the semiconductor device package as shown in FIG. 6A in accordance with some embodiments of the present disclosure.

FIG. 6C illustrates a coupling structure of the semiconductor device package 6 as shown in FIG. 6A. The coupling structure includes three layers of antenna or radiator 60. The coupling structure may include more or less layers of antenna. The coupling structure may help expanding bandwidth of the working frequency of the semiconductor device package 6.

Figure 6D:
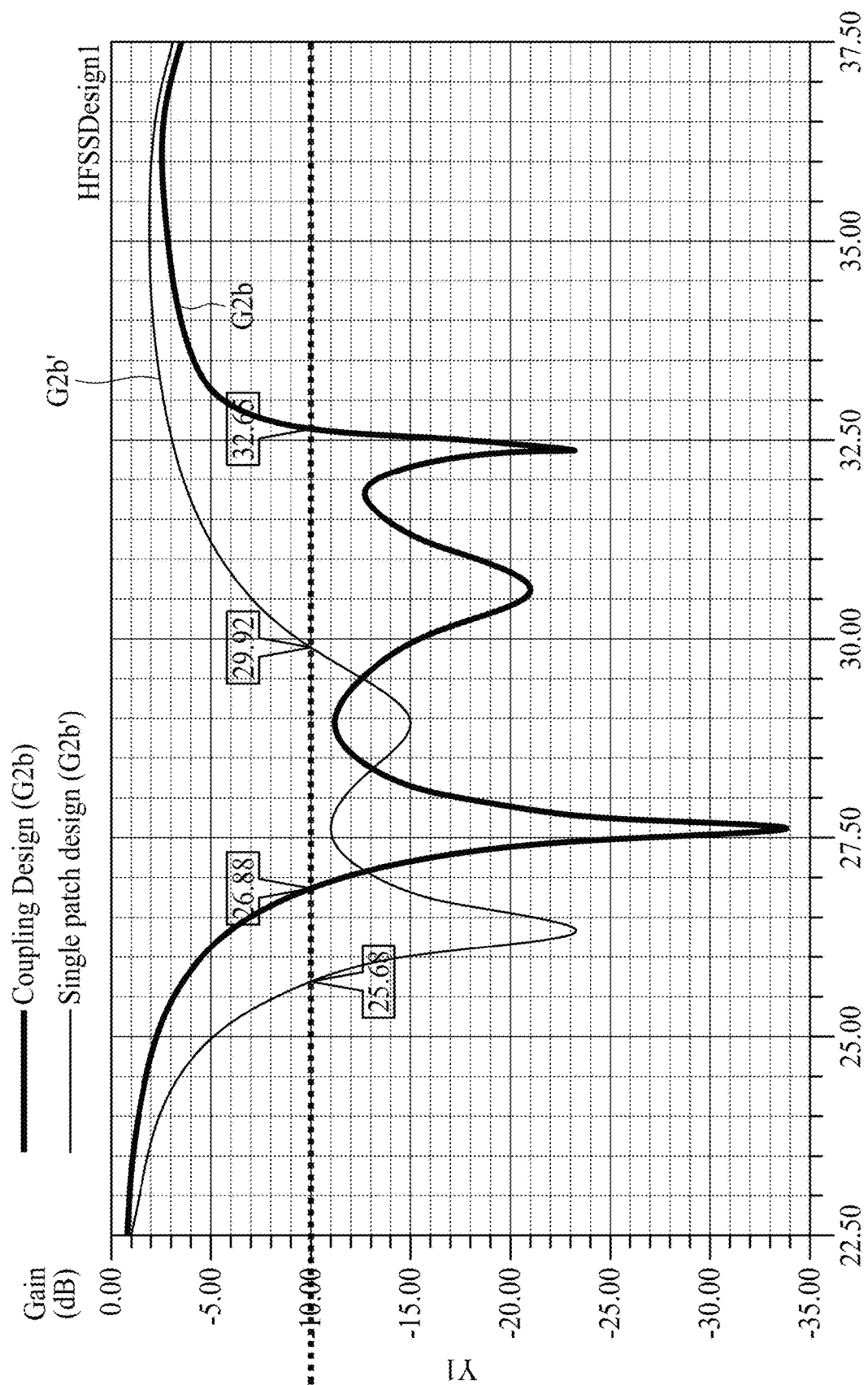
FIG. 6D shows frequency response of different semiconductor device packages in accordance with some embodiments of the present disclosure.

FIG. 6D shows frequency response of different semiconductor device packages in accordance with some embodiments of the present disclosure.

Referring to FIG. 6D, the curve G2b represents frequency response of the semiconductor device package 6 as shown in FIG. 6A. The curve G2b' represents frequency response of another semiconductor device package (not shown) similar to the semiconductor device package 6 as shown in FIG. 6A, except that the conductive layer 40p and the carrier 40 are eliminated. The semiconductor device package 6, which has a coupling design, has a relatively broad/wide bandwidth of work frequency.

Figure 7A:
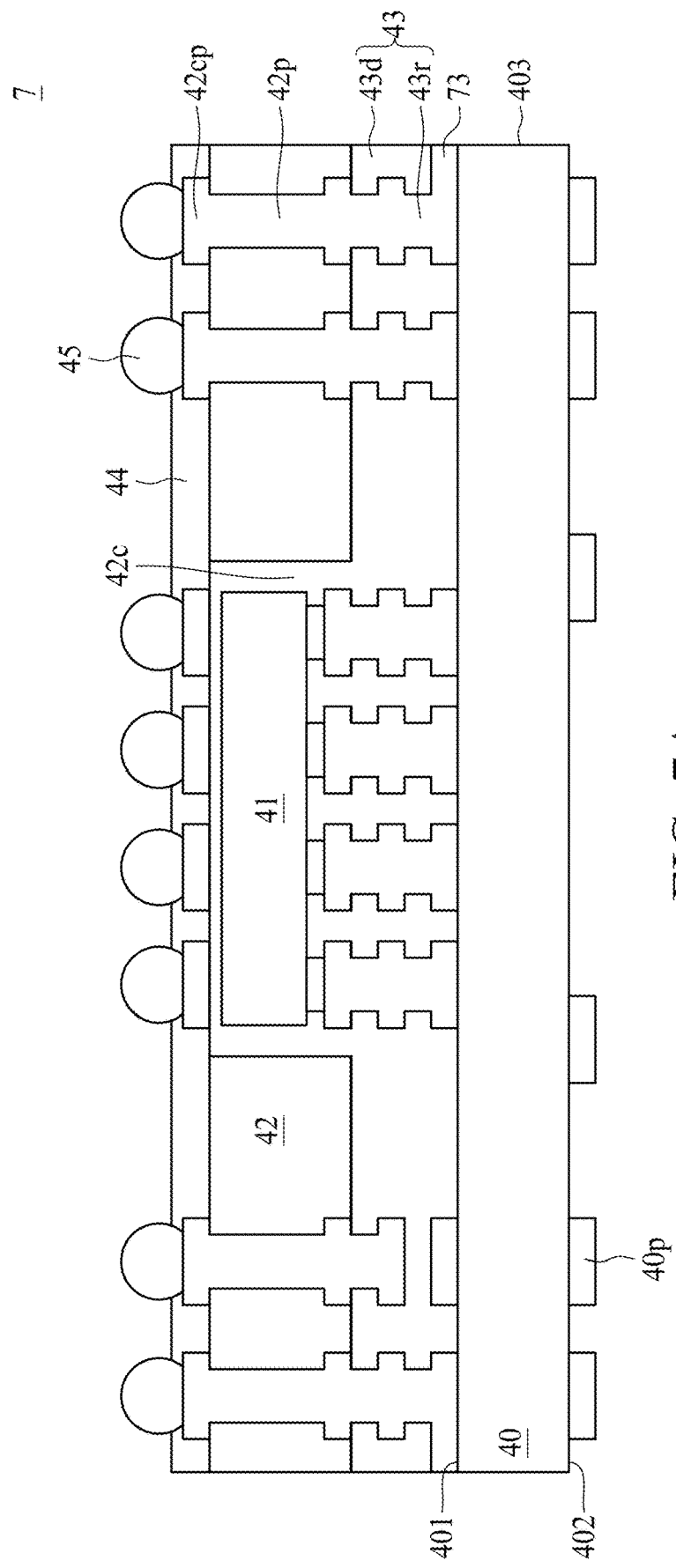
FIG. 7A illustrates a cross-sectional view of a semiconductor device package in accordance with some embodiments of the present disclosure.

FIG. 7A illustrates a cross-sectional view of a semiconductor device package 7 in accordance with some embodiments of the present disclosure. The semiconductor device package 7 is similar to the semiconductor device package 4 in FIG. 4, and the difference therebetween are described below.

The semiconductor device package 7 includes an antenna 73 disposed on the surface 401 of the carrier 40 and adjacent to a lateral surface 403 of the carrier 40. In some embodiments, the antenna 73 is or includes a dipole antenna. In some embodiments, the dipole antenna may include a two-dimension (2D) dipole antenna or a three-dimension (3D) dipole antenna. In some embodiments, the antenna 73 is electrically connected to the interconnection layer 43r.

Figure 7B:
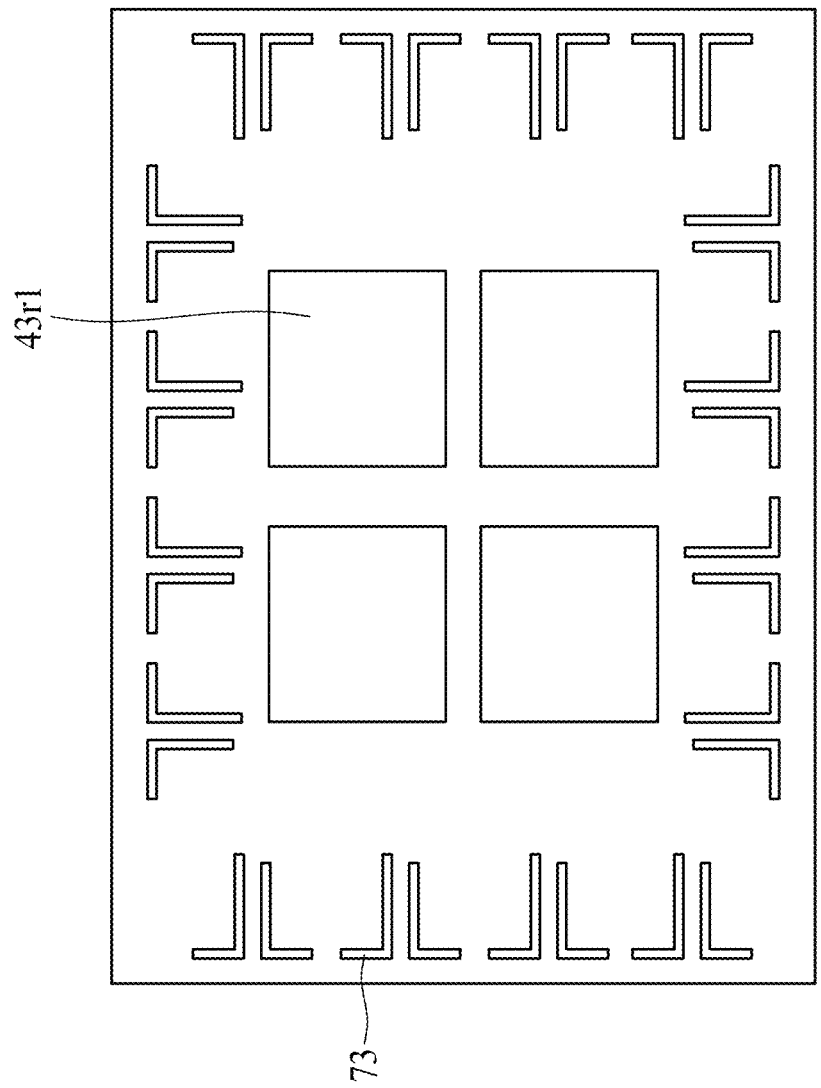
FIG. 7B illustrates a top view of the interconnection layer of the semiconductor device package as shown in FIG. 7A in accordance with some embodiments of the present disclosure.

FIG. 7B illustrates a top view of the interconnection layer 43r of the circuit layer 43 of the semiconductor device package 7 as shown in FIG. 7A. Referring to FIG. 7B, the interconnection layer 43r may include a patch antenna surrounded the by the antenna 73 (e.g., dipole antenna array).

Figure 7C:
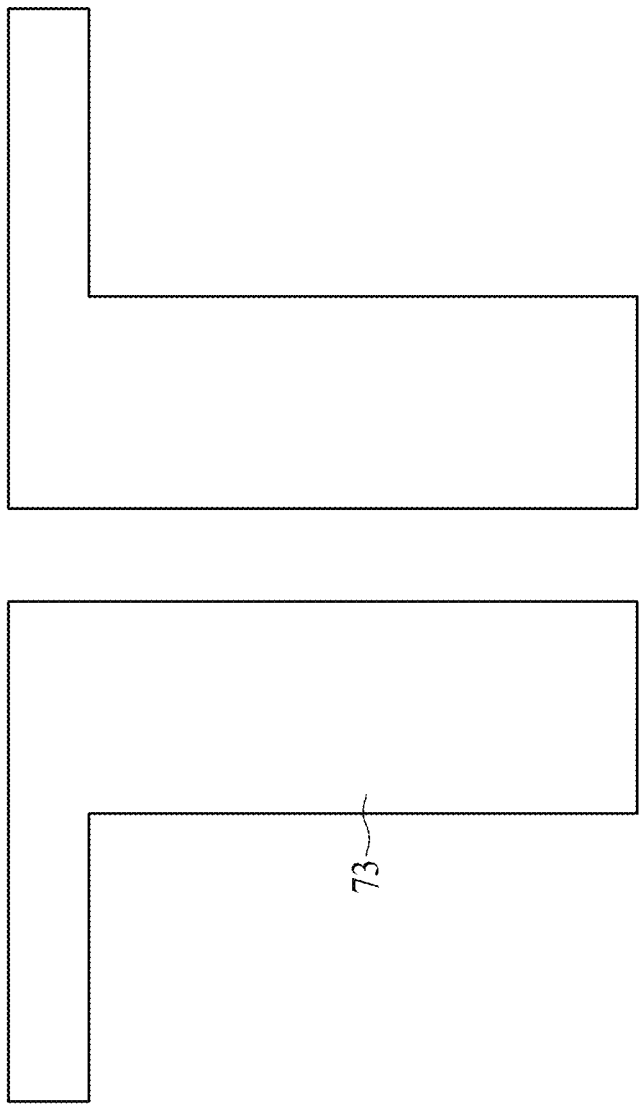
FIG. 7C illustrates an enlarged view of the antenna as shown in FIG. 7A in accordance with some embodiments of the present disclosure.

FIG. 7C illustrates an enlarged view of the antenna 73 as shown in FIG. 7A in accordance with some embodiments of the present disclosure. Referring to FIG. 7C, the antenna 73 may include a 2D dipole antenna. The antenna 73 may include patterned conductive traces.

Figure 7D:
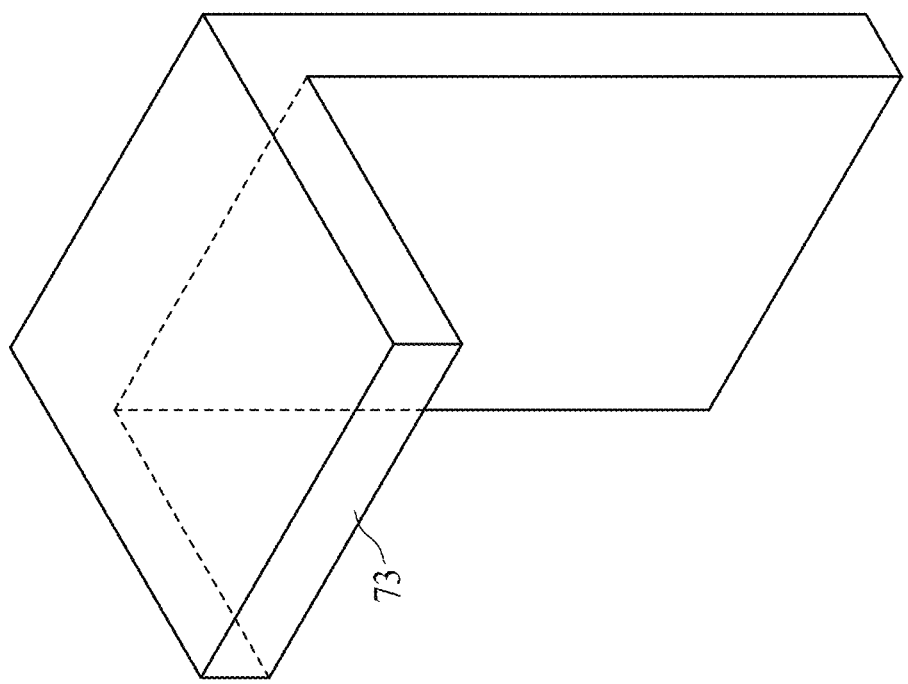
FIG. 7D illustrates a perspective view of the antenna as shown in FIG. 7A in accordance with some embodiments of the present disclosure.

FIG. 7D illustrates a perspective view of the antenna 73 as shown in FIG. 7A in accordance with other embodiments of the present disclosure. Referring to FIG. 7D, the antenna 73 may include a 3D dipole antenna. The antenna 73 may include a bent conductive piece or plate. The antenna 73 may include an "L" shape or "L-like" shape of conductive piece or plate.

Figure 8:
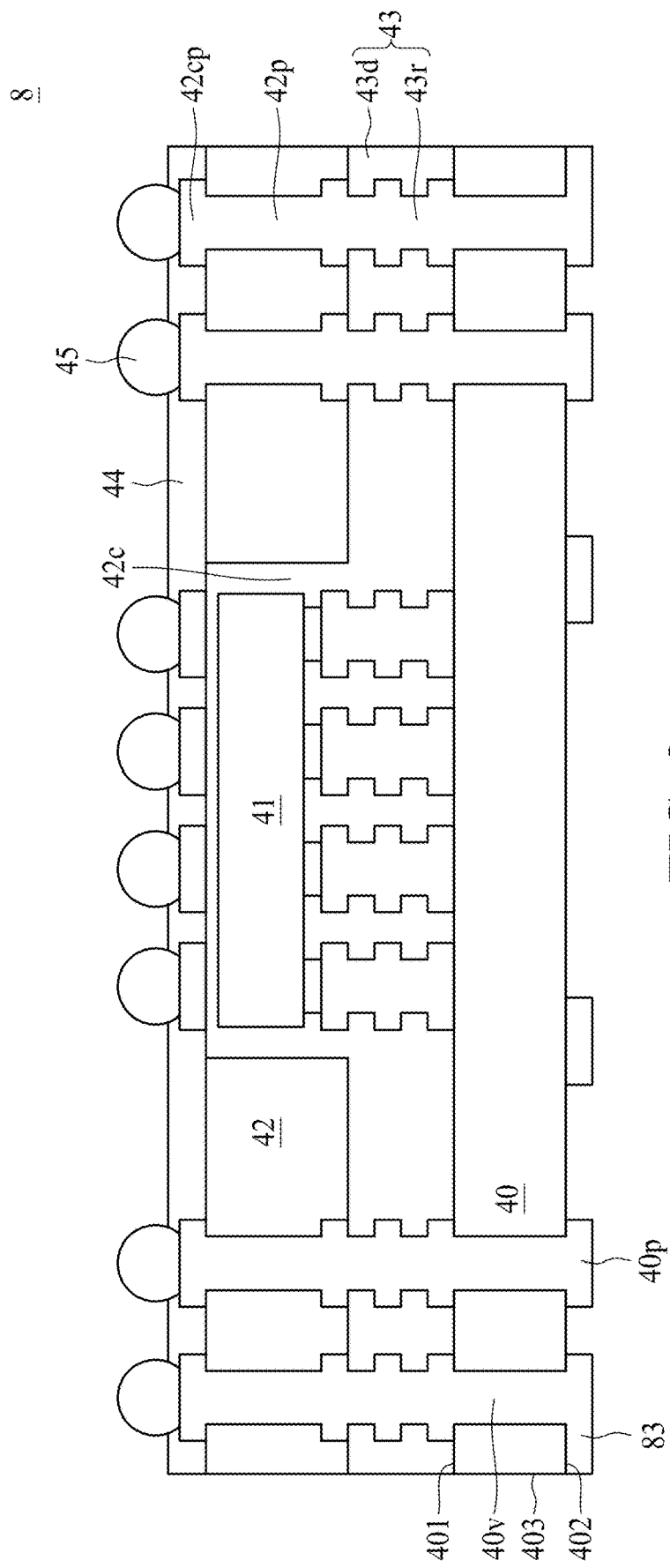
FIG. 8 illustrates a cross-sectional view of a semiconductor device package in accordance with some embodiments of the present disclosure.

FIG. 8 illustrates a cross-sectional view of a semiconductor device package 8 in accordance with some embodiments of the present disclosure. The semiconductor device package 8 is similar to the semiconductor device package 6 in FIG. 6A, and the difference therebetween are described below.

The semiconductor device package 8 includes an antenna 83 disposed on the surface 402 of the carrier 40 and adjacent to a lateral surface 403 of the circuit layer 40. In some embodiments, the antenna 83 is electrically connected to the interconnection layer 43r by the conductive elements 40v. In some embodiments, the antenna 83 is electrically connected to the conductive layer 40p. In some embodiments, the antenna 83 is or includes a dipole antenna. In some embodiments, the dipole antenna may include a 2D dipole antenna or a 3D dipole antenna. In some embodiments, the antenna 83 has a structure same as or similar to the antenna 73 as shown in FIGS. 7A, 7B, 7C and 7D.

Figure 9:
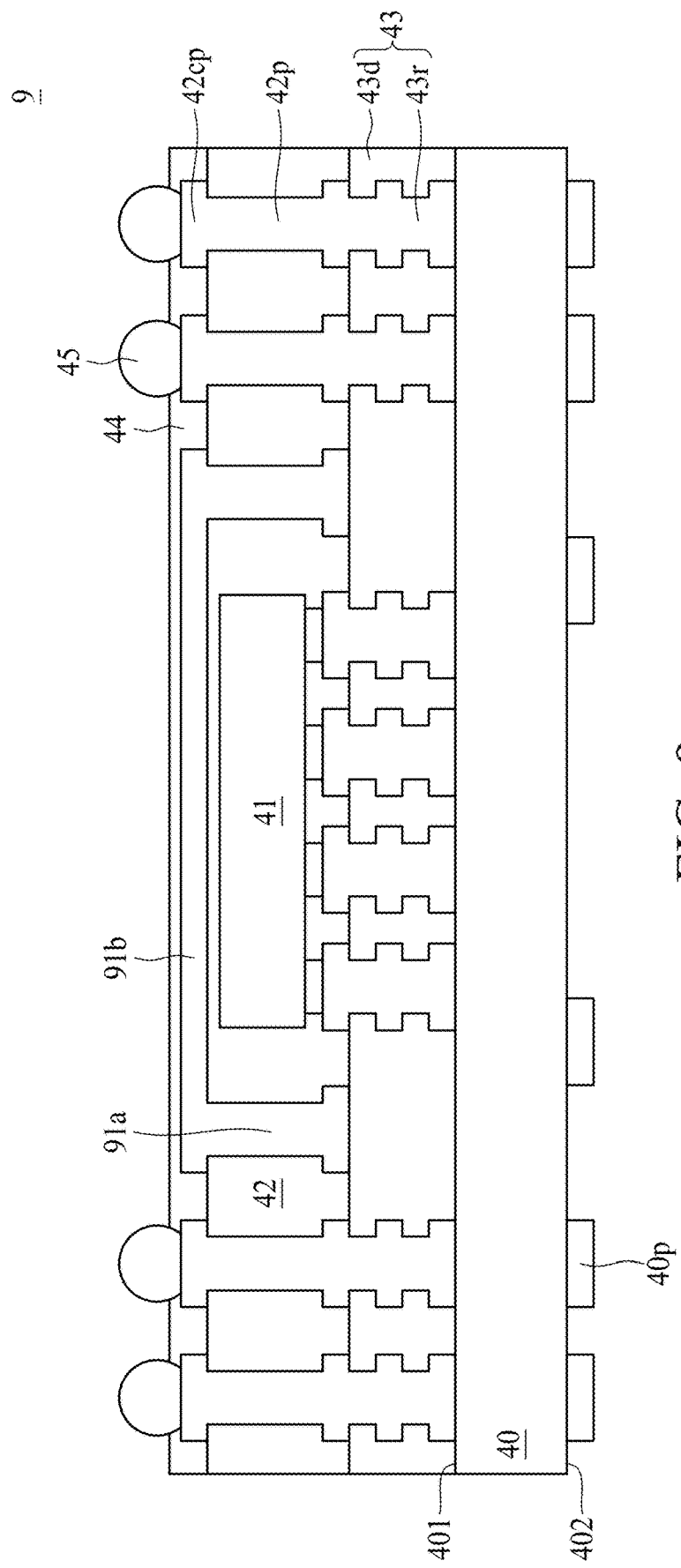
FIG. 9 illustrates a cross-sectional view of a semiconductor device package in accordance with some embodiments of the present disclosure.

FIG. 9 illustrates a cross-sectional view of a semiconductor device package 9 in accordance with some embodiments of the present disclosure. The semiconductor device package 9 is similar to the semiconductor device package 6 in FIG. 6A, and the difference therebetween are described below.

The semiconductor device package 9 further includes conductive elements 91a and 91b. The conductive element 91a is disposed on the circuit layer 43 and adjacent to the electronic component 41. A portion of the conductive element 91a is encapsulated by the package body 42 while another portion of the conductive element 91a is exposed from the package body 42. In some embodiments, the conductive element 91a surrounds the electronic component 41. The conductive element 91b is disposed on the package body 42 and electrically connected to the conductive element 91a. The conductive elements 91a and 91b may define an EMI shield to protect the electronic component 41 from EMI.

Figure 10:
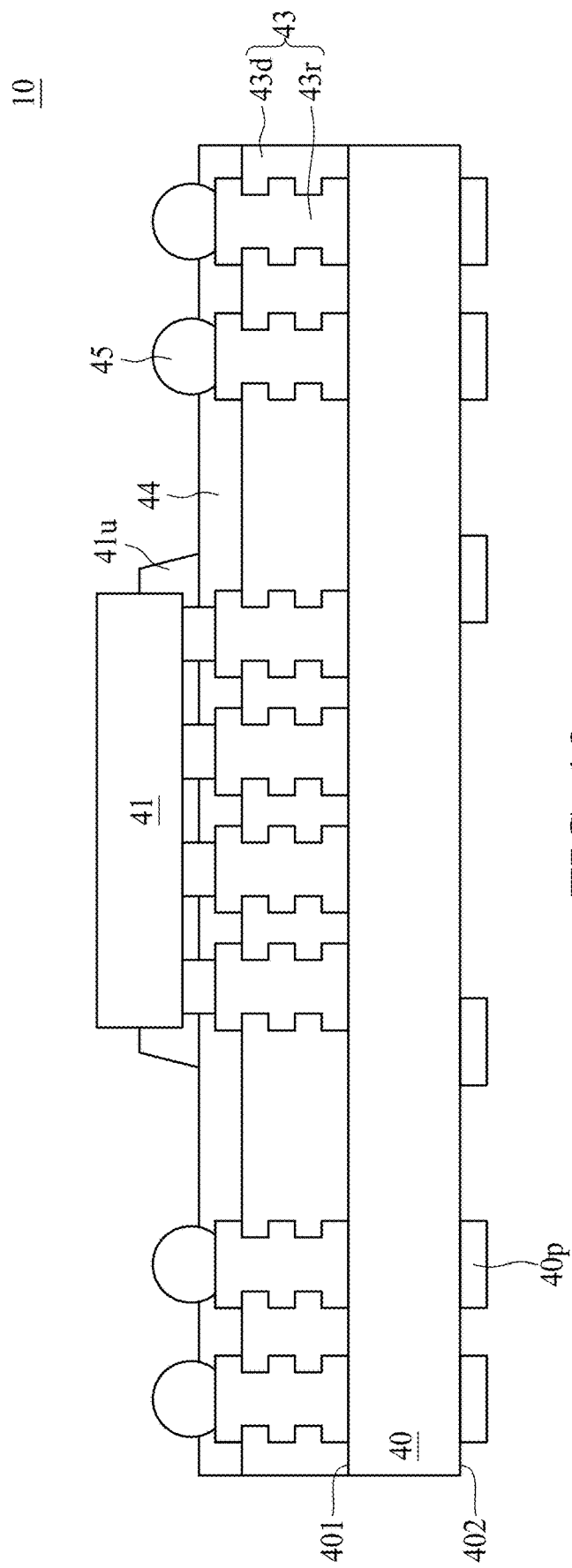
FIG. 10 illustrates a cross-sectional view of a semiconductor device package in accordance with some embodiments of the present disclosure.

FIG. 10 illustrates a cross-sectional view of a semiconductor device package 10 in accordance with some embodiments of the present disclosure. The semiconductor device package 10 is similar to the semiconductor device package 6 in FIG. 6A, and the difference therebetween are described below.

Referring to FIG. 10, the package body 42 is omitted. The protection layer 44 is disposed on the circuit layer 43. The protection layer 44 covers a portion of the interconnection layer 43r exposed from the dielectric layer 43d and exposes another portion of the interconnection layer 43r exposed from the dielectric layer 43d. An underfill 41u is disposed between the active surface of the electronic component 41 and the protection layer 44. In some embodiments, the underfill 41u may include fillers having relatively small size than those of the package body 42. In some embodiments, the underfill 41u may have no fillers. In other embodiments, the underfill 41u can be omitted. The electrical contacts 45 are disposed on the exposed portion of the interconnection layer 43r of the circuit layer 43.

Figure 11:
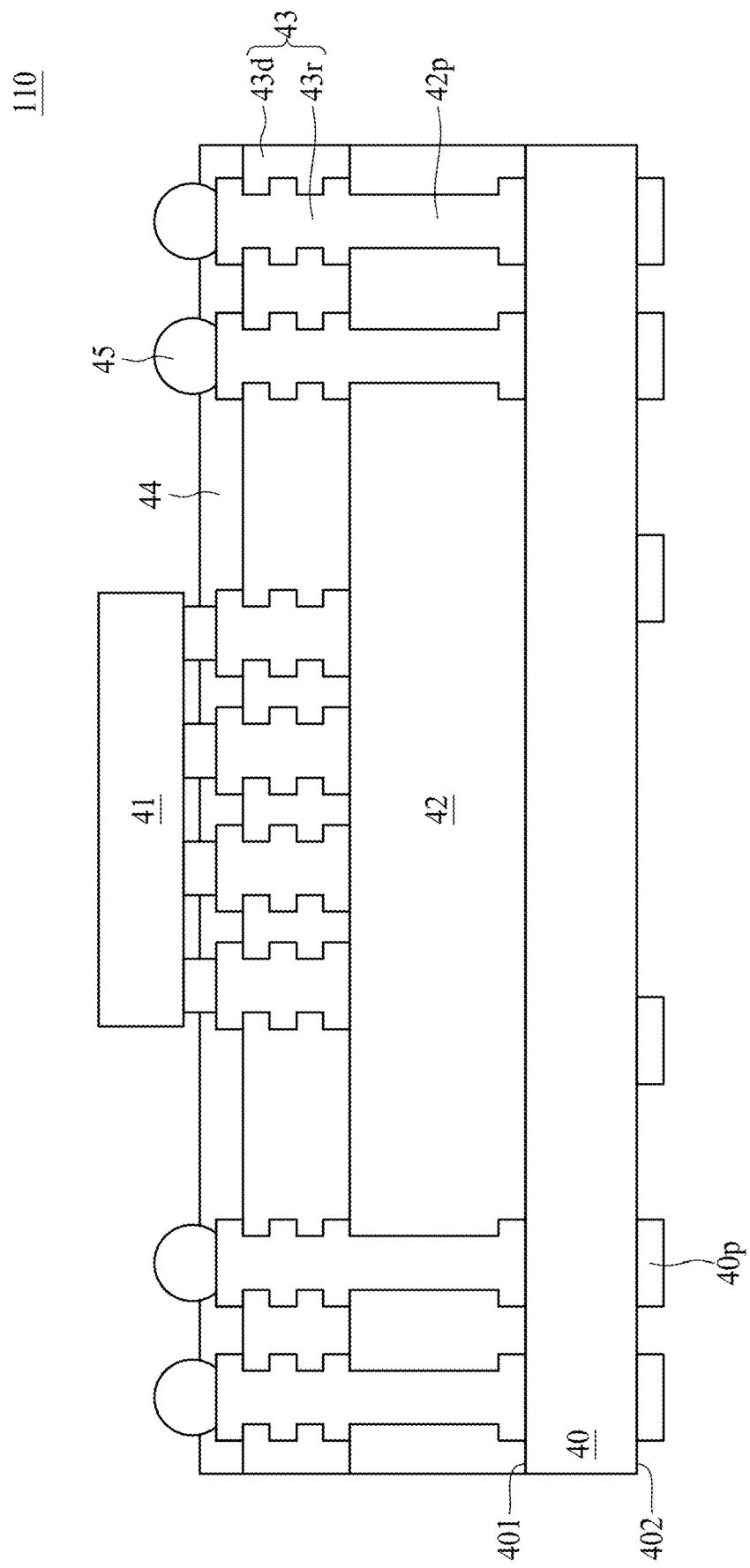
FIG. 11 illustrates a cross-sectional view of a semiconductor device package in accordance with some embodiments of the present disclosure.

FIG. 11 illustrates a cross-sectional view of a semiconductor device package 110 in accordance with some embodiments of the present disclosure. The semiconductor device package 110 is similar to the semiconductor device package 10 in FIG. 10, except that the semiconductor device package 110 further includes the package body 42 disposed between the circuit layer 43 and the carrier 40. One or more interconnection structures 42p penetrate the package body 42 to electrically connect to the interconnection layer 43r of the circuit layer 43.

FIG. 12A, FIG. 12B, FIG. 12C, FIG. 12D and FIG. 12E illustrate a semiconductor manufacturing method in accordance with some embodiments of the present disclosure. In some embodiments, the method in FIG. 12A, FIG. 12B, FIG. 12C, FIG. 12D and FIG. 12E can be used to manufacture the semiconductor device package 5 in FIG. 5.

Figure 12A:
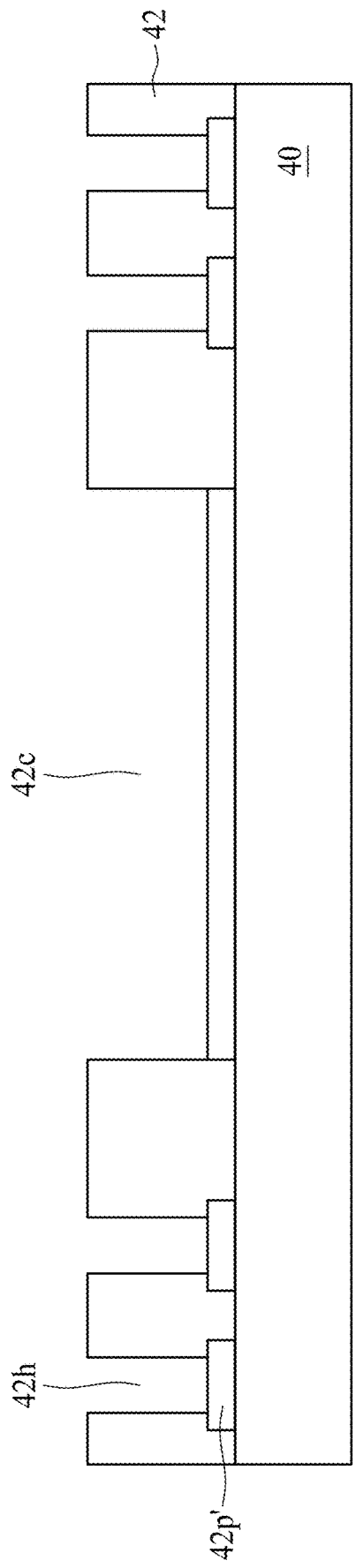
FIG. 12A, FIG. 12B, FIG. 12C, FIG. 12D and FIG. 12E illustrate a semiconductor manufacturing method in accordance with some embodiments of the present disclosure.

Referring to FIG. 12A, a carrier 40 is provided. A package body 42 is formed on the carrier 40. The package body 42 includes a molding compound material. The molding compound material may include an epoxy-based resin with fillers dispersed therein. The package body is formed by, for example, a transfer molding technique, a compression technique, an immersion technique, a laser drill technique, photolithographic technique, another applicable technique, or a combination thereof. One or more openings 42h and a cavity 42c are formed to penetrate the package body 42 to expose the carrier 40. A patterned conductive layer 42p' is formed with the openings 42h and the cavity 42c.

Figure 12B:
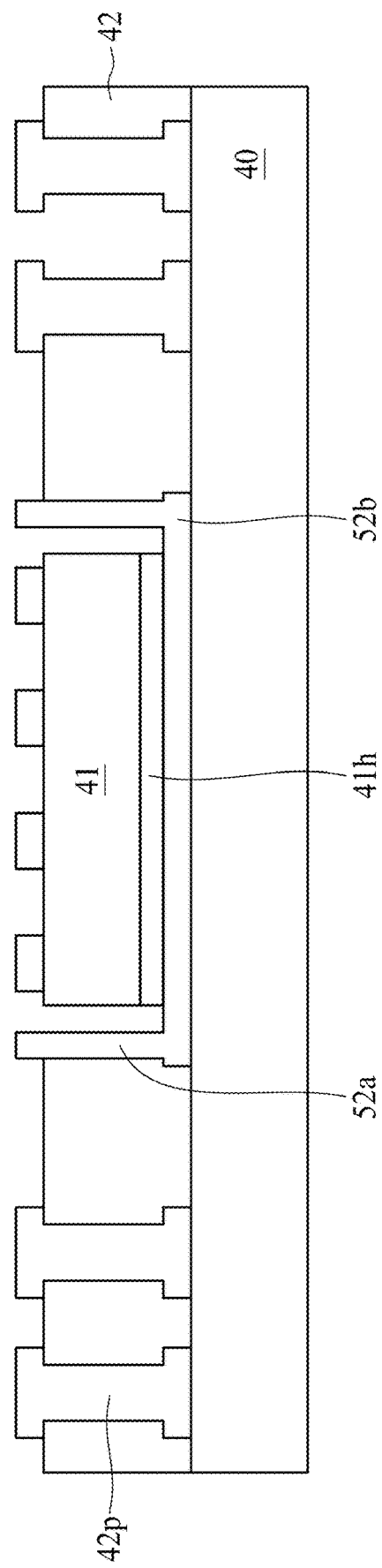

Referring to FIG. 12B, interconnection structure 42p are formed on the patterned conductive layer 42p' as shown in FIG. 12A by, for example but is not limited to, plating technique. The interconnection structure 42p may include conductive elements 52a and 52b. An electronic component 41 is attached to the conductive element 52b by an adhesion element 41h.

Figure 12C:
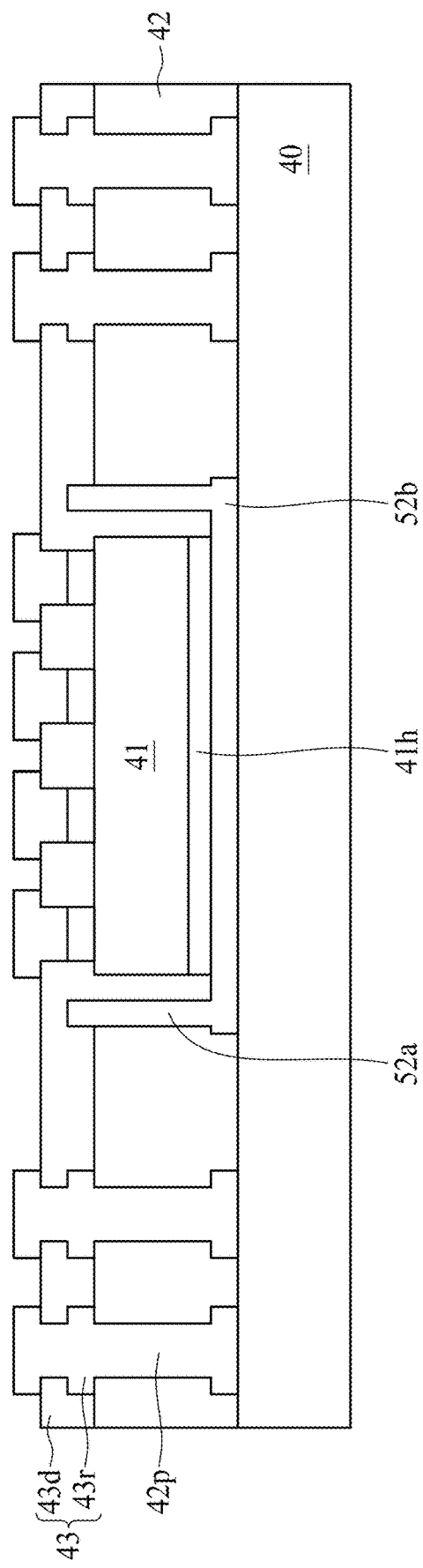

Referring to FIG. 12C, a circuit layer 43, which may include a dielectric layer 43d and interconnection layer 43r (e.g., RDL structure), is formed on the package body 42. The interconnection layer 43r is electrically connected to the interconnection structure 42p and conductive terminals of the electronic components 41. The dielectric layer 43d is formed by, for example but is not limited to, photolithographic technique. The interconnection layer 43r is formed by, for example but is not limited to, plating technique.

Figure 12D:
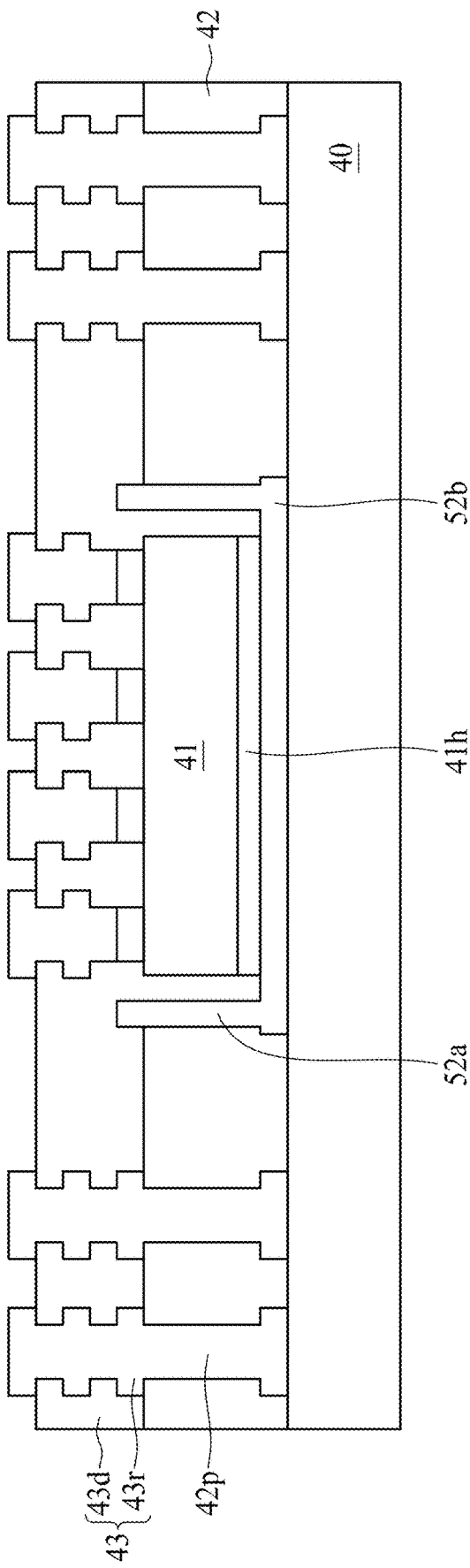

Referring to FIG. 12D, more RDL structure(s) may be formed on the RDL structure as shown in FIG. 12C. In some embodiments, there are any numbers of RDL structures depending on different design specifications.

Figure 12E:
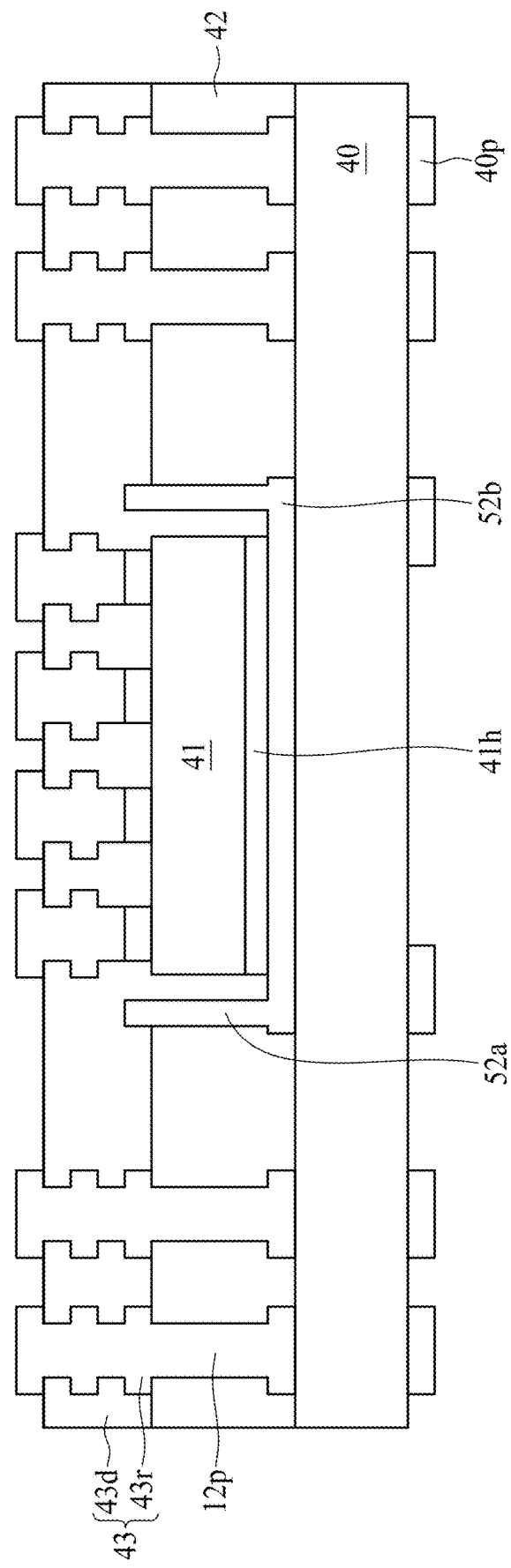

Referring to FIG. 12E, a portion of the carrier 40 as shown in FIG. 12D is removed from the lower side or bottom side by, for example but is not limited to, grinding technique. The conductive layer 40p (e.g., patterned antenna) is formed on thinned or grinded carrier 40. In some embodiments, the carrier 40 may include glass, which may facilitate alignment between the conductive layer 40p and the interconnection layer 43r. In some embodiments, the carrier 40 may include glass, which may mitigate warpage issue which may occur in various manufacturing stages.

In some embodiment, the protection layer 44 and electrical contacts 45 are formed on the interconnection layer 43r exposed from the dielectric layer 43d to form the semiconductor device package 5 as shown in FIG. 5.

FIG. 13A, FIG. 13B, FIG. 13C, FIG. 13D and FIG. 13E illustrate a semiconductor manufacturing method in accordance with some embodiments of the present disclosure. In some embodiments, the method in FIG. 13A, FIG. 13B, FIG. 13C, FIG. 13D and FIG. 13E can be used to manufacture the semiconductor device package 9 in FIG. 9.

Figure 13A:
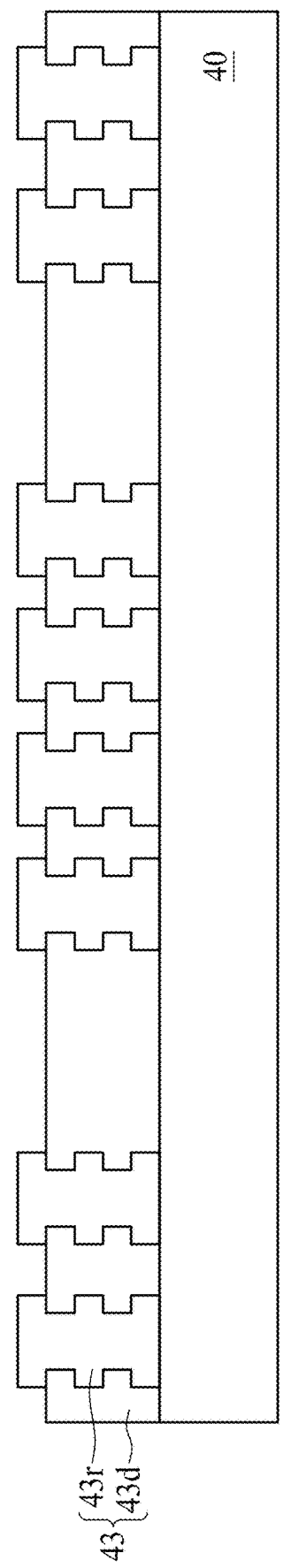
FIG. 13A, FIG. 13B, FIG. 13C, FIG. 13D and FIG. 13E illustrate a semiconductor manufacturing method in accordance with some embodiments of the present disclosure.

Referring to FIG. 13A, a carrier 40 is provided. A circuit layer 43 (e.g., RDL structure), which may include a dielectric layer 43d and an interconnection layer 43r, is formed on the carrier 40. The dielectric layer 43d is formed by, for example but is not limited to, photolithographic technique. The interconnection layer 43r is formed by, for example but is not limited to, plating technique.

Figure 13B:
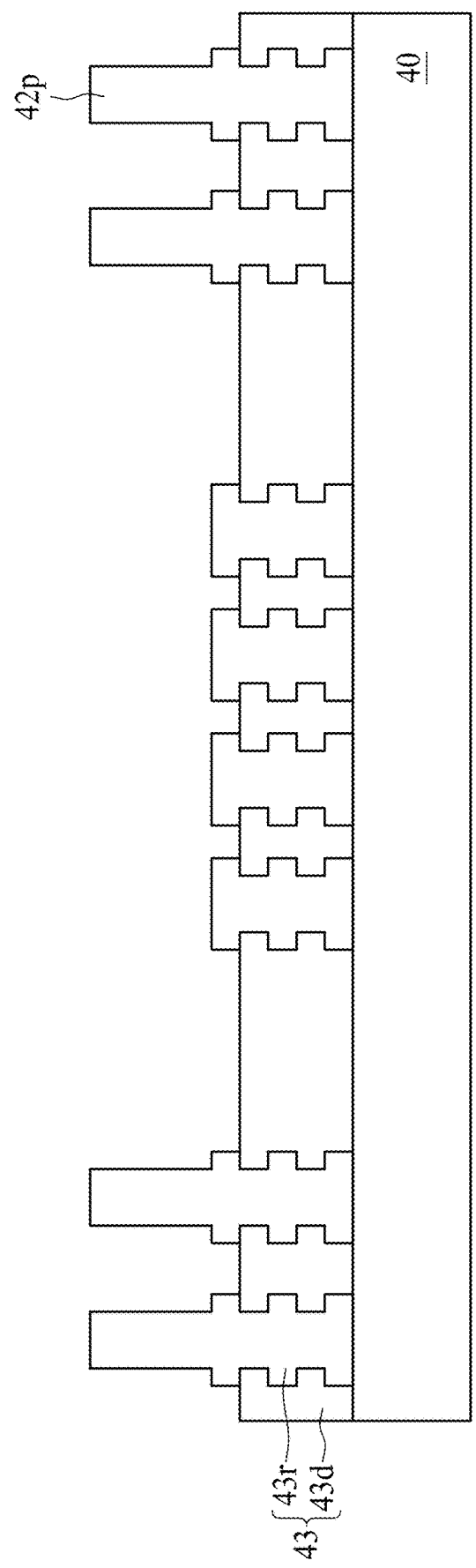

Referring to FIG. 13B, the interconnection structure 42p and the conductive element 91a are formed on the circuit layer 43 to electrically connect to interconnection layer 43r exposed from the dielectric layer 43d. In some embodiments, the interconnection structure 42p and the conductive element 91a are formed by, for example but is not limited to, plating technique.

Figure 13C:
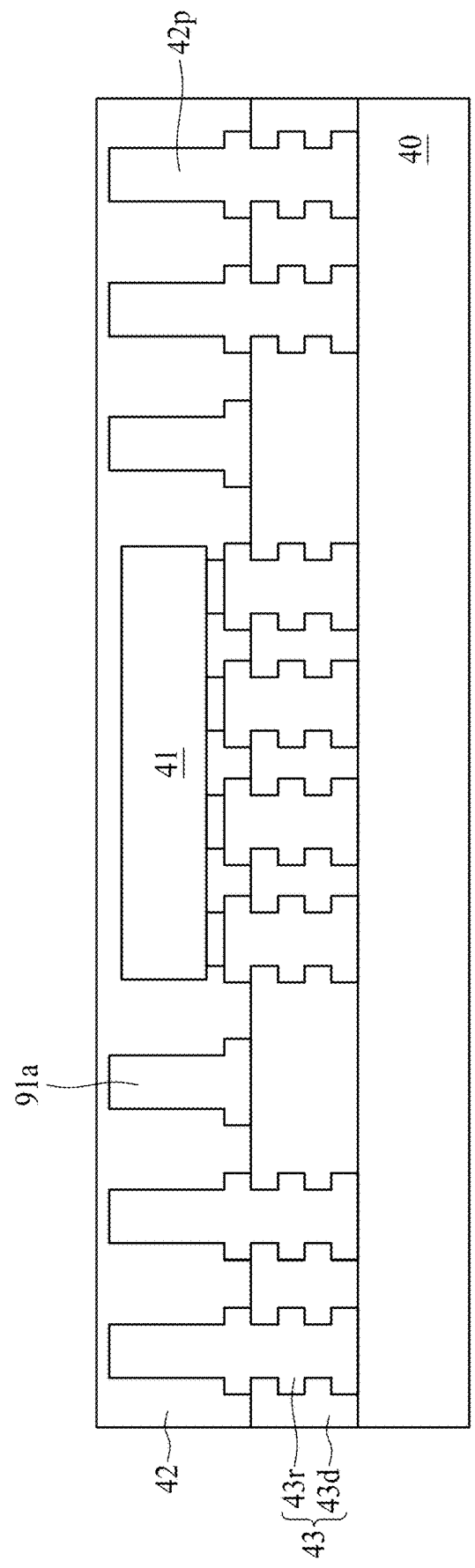

Referring to FIG. 13C, an electronic component 41 is attached or bonded to the interconnection layer 43r exposed from the dielectric layer 43d. A package body 42 is formed to encapsulate the interconnection structure 42p, the conductive element 91a and the electronic component 41. The package body 42 may include a molding compound material.

Figure 13D:
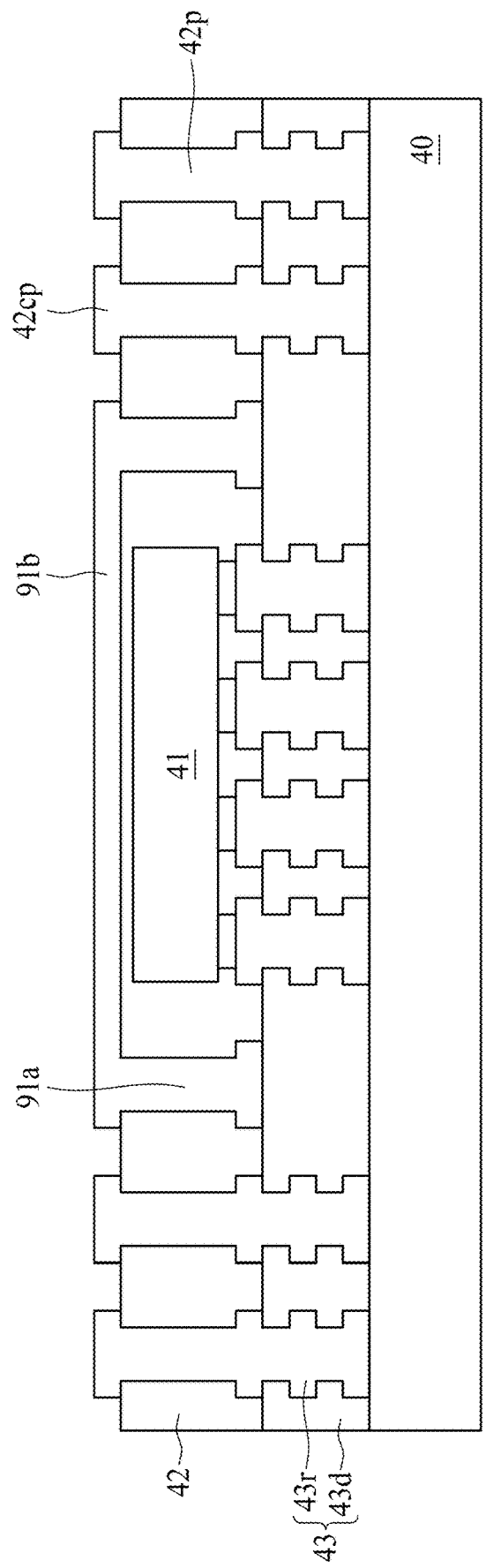

Referring to FIG. 13D, parts of the package body 42 is removed to expose the interconnection structure 42p and the conductive element 91a. A patterned conductive layer 42cp (including the conductive element 91b) is formed on the package body 42. The conductive layer 42cp is electrically connected to the interconnection structure 42p, and the conductive element 91b is electrically connected to the conductive element 91a.

Figure 13E:
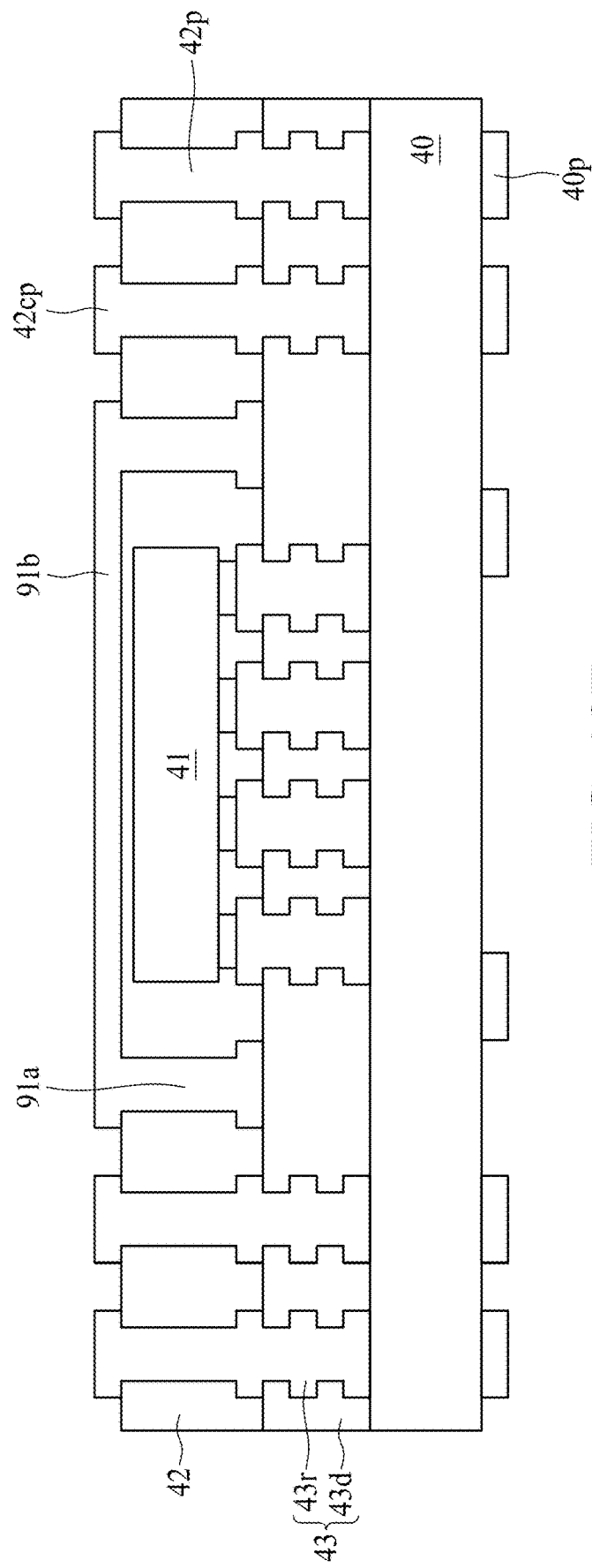

Referring to FIG. 13E, a portion of the carrier 40 as shown in FIG. 13D is removed from the lower side or bottom side by, for example but is not limited to, grinding technique. The conductive layer 40p (e.g., patterned antenna) is formed on thinned or grinded carrier 40. In some embodiments, the carrier 40 may include glass, which may facilitate alignment between the conductive layer 40p and the interconnection layer 43r. In some embodiments, the carrier 40 may include glass, which may mitigate warpage issue which may occur in various manufacturing stages.

In some embodiment, the protection layer 44 and electrical contacts 45 are formed on package body 42 to form the semiconductor device package 9 as shown in FIG. 9.

FIG. 14A, FIG. 14B, FIG. 14C and FIG. 14D illustrate a semiconductor manufacturing method in accordance with some embodiments of the present disclosure. In some embodiments, the method in FIG. 14A, FIG. 14B, FIG. 14C and FIG. 14D can be used to manufacture the semiconductor device package 10 in FIG. 10.

Figure 14A:
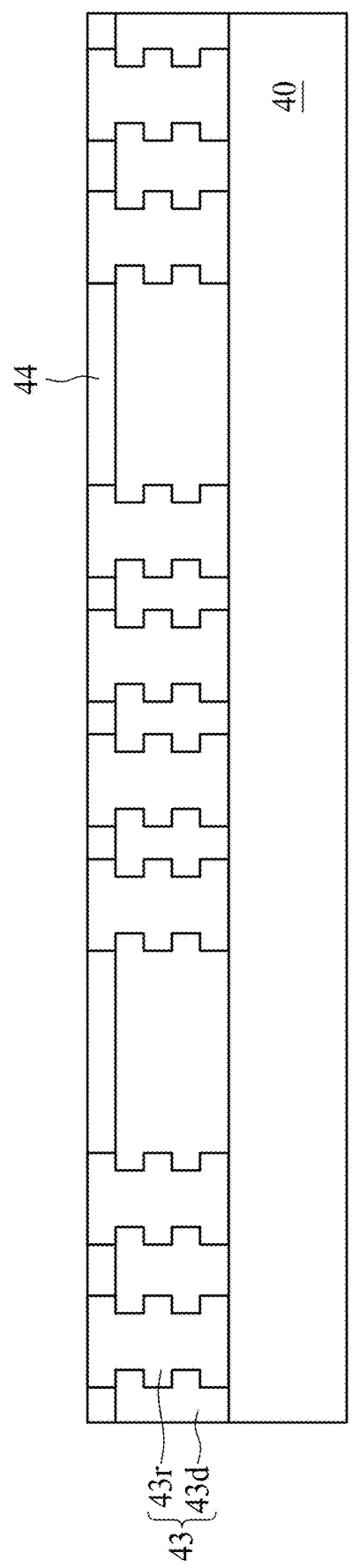
FIG. 14A, FIG. 14B, FIG. 14C and FIG. 14D illustrate a semiconductor manufacturing method in accordance with some embodiments of the present disclosure.

Referring to FIG. 14A, a carrier 40 is provided. A circuit layer 43 (e.g., RDL structure), which may include a dielectric layer 43d and an interconnection layer 43r, is formed on the carrier 40. The dielectric layer 43d is formed by, for example but is not limited to, photolithographic technique. The interconnection layer 43r is formed by, for example but is not limited to, plating technique. The protection layer 44 is formed on the circuit layer 43 to expose a portion of the interconnection layer 43r.

Figure 14B:
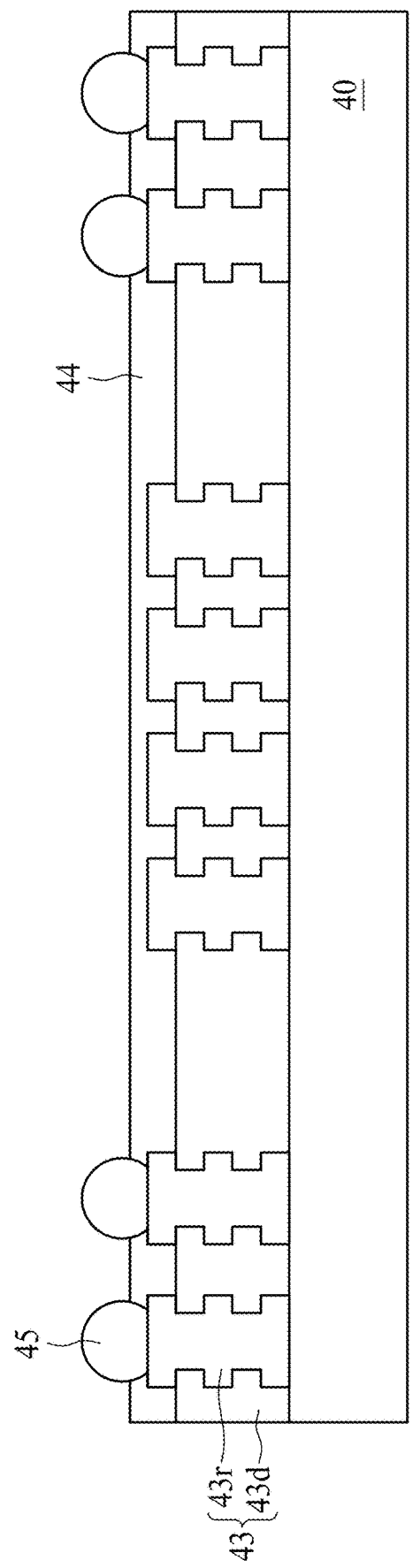

Referring to FIG. 14B, electrical contacts 45 are formed on the protection layer 44 and electrically connected to the interconnection layer 43r exposed from the protection layer 44.

Figure 14C:
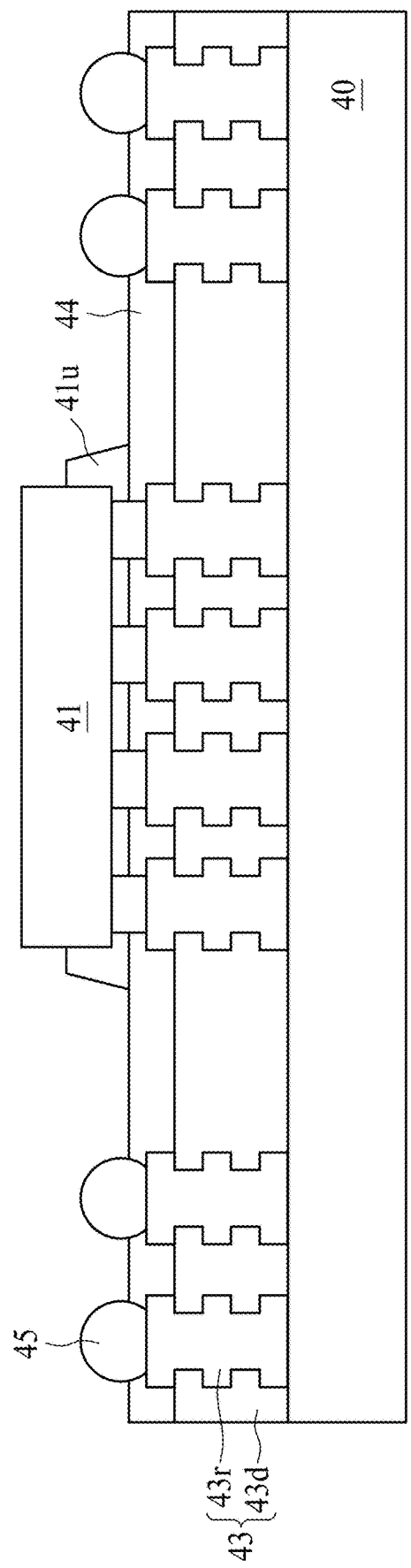

Referring to FIG. 14C, an electronic component 41 is attached or bonded to the interconnection layer 43r exposed from the protection layer 44. An underfill 41u is formed between the electronic component 41 and circuit layer 43.

Figure 14D:
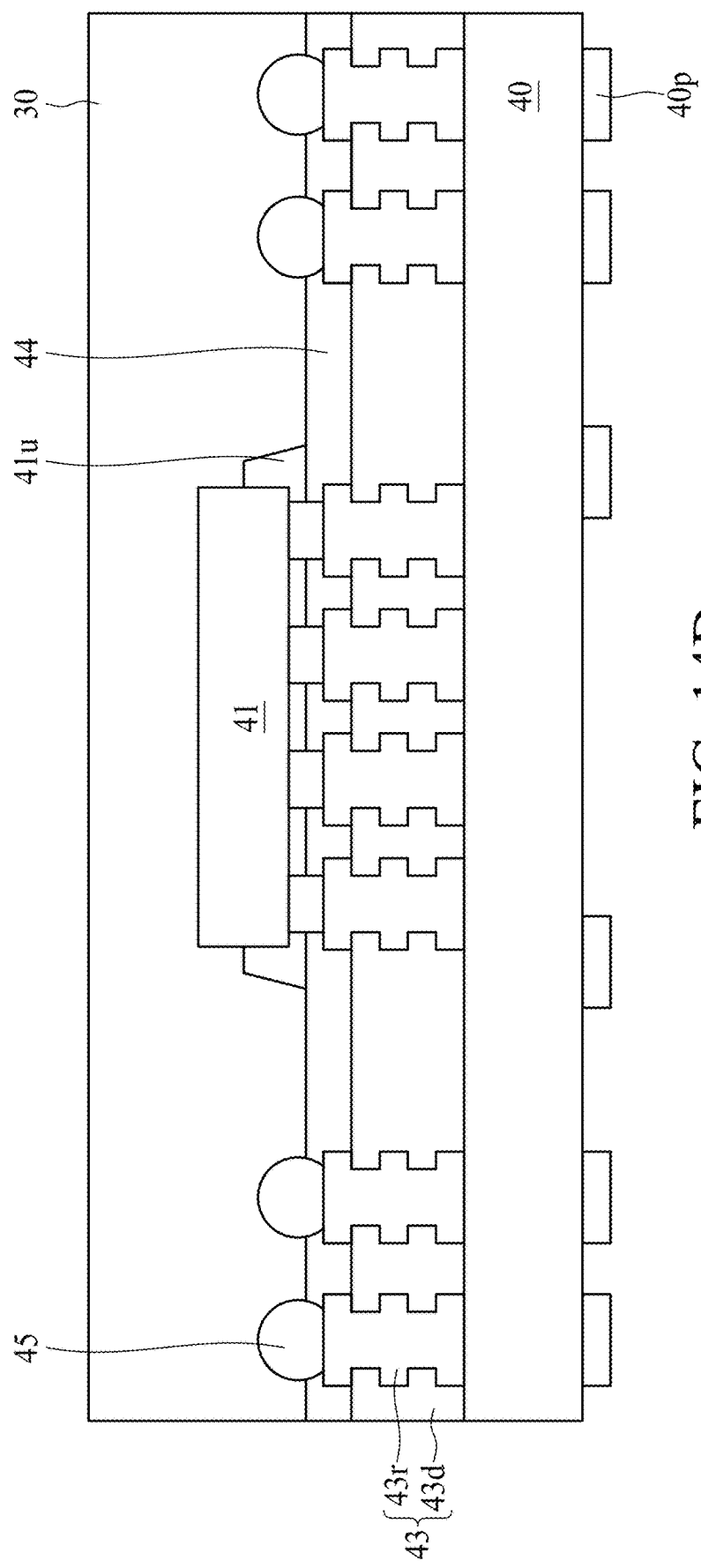

Referring to FIG. 14D, the structure as shown in FIG. 14C is bonded to or disposed onto a carrier 30 (e.g. a tape frame). As shown in FIG. 14D, at least a portion of the electronic component 41, the underfill 41u and the electrical contacts 45 are within or covered by the carrier 30. The conductive layer 40p (e.g., antenna pattern) is formed on a surface of the carrier 40 facing away from the circuit layer 43.

In some embodiments, the carrier 30 is removed to form the semiconductor device package 10 as shown in FIG. 11.

FIG. 15A, FIG. 15B, FIG. 15C, FIG. 15D, FIG. 15E and FIG. 15F illustrate a semiconductor manufacturing method in accordance with some embodiments of the present disclosure.

Figure 15A:
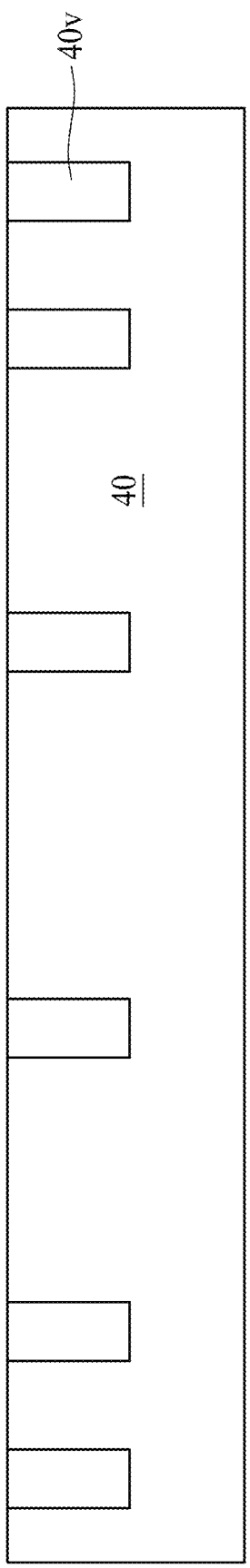
FIG. 15A, FIG. 15B, FIG. 15C, FIG. 15D, FIG. 15E and FIG. 15F illustrate a semiconductor manufacturing method in accordance with some embodiments of the present disclosure.

Referring to FIG. 15A, a carrier 40 is provided. Conductive elements 40v are formed in the carrier 40. In some embodiments, the conductive elements 40v extend within the carrier 40 without penetrating through the carrier 40.

Figure 15B:
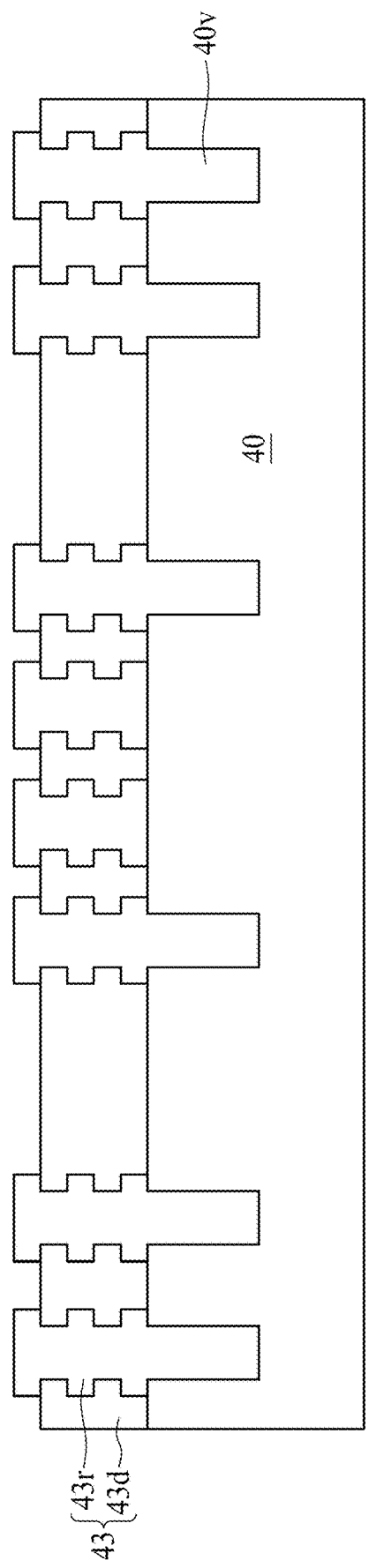

Referring to FIG. 15B, a circuit layer 43 (e.g., RDL structure), which may include a dielectric layer 43d and an interconnection layer 43r, is formed on the carrier 40. The interconnection layer 43r is electrically connected to the conductive elements 40v. The dielectric layer 43d is formed by, for example but is not limited to, photolithographic technique. The interconnection layer 43r is formed by, for example but is not limited to, plating technique.

Figure 15C:
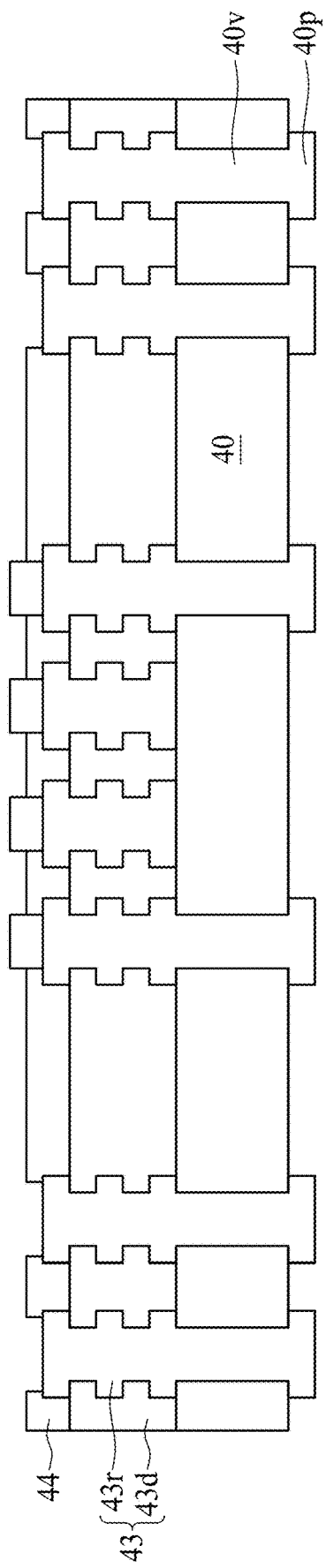

Referring to FIG. 15C, the protection layer 44 is formed on the circuit layer 43 to expose a portion of the interconnection layer 43r. A part of the carrier 40 as shown in FIG. 15B is removed from the lower side or bottom side by, for example but is not limited to, grinding technique. A part of the carrier 40 as shown in FIG. 15B is removed to expose the conductive elements 40v. The conductive layer 40p (e.g., patterned antenna) is formed on thinned or grinded carrier 40. In some embodiments, the carrier 40 may include glass, which may facilitate alignment between the conductive layer 40p and the interconnection layer 43r. In some embodiments, the carrier 40 may include glass, which may mitigate warpage issue which may occur in various manufacturing stages.

Figure 15D:
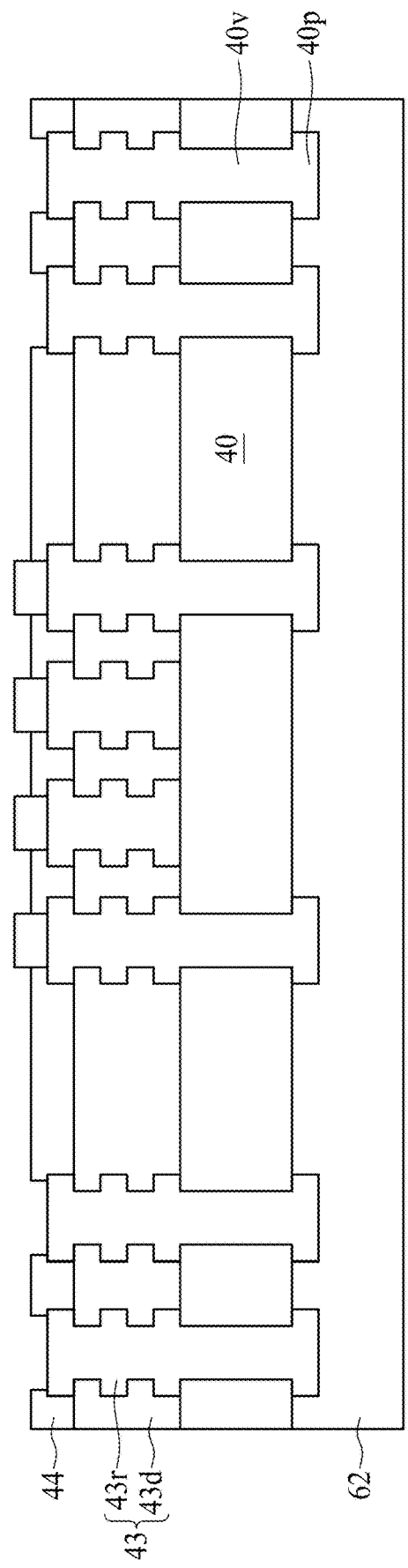

Referring to FIG. 15D, a package body 62 is formed on the carrier 40 to encapsulate or cover the conductive layer 40p. The package body 42 may include a molding compound material.

Figure 15E:
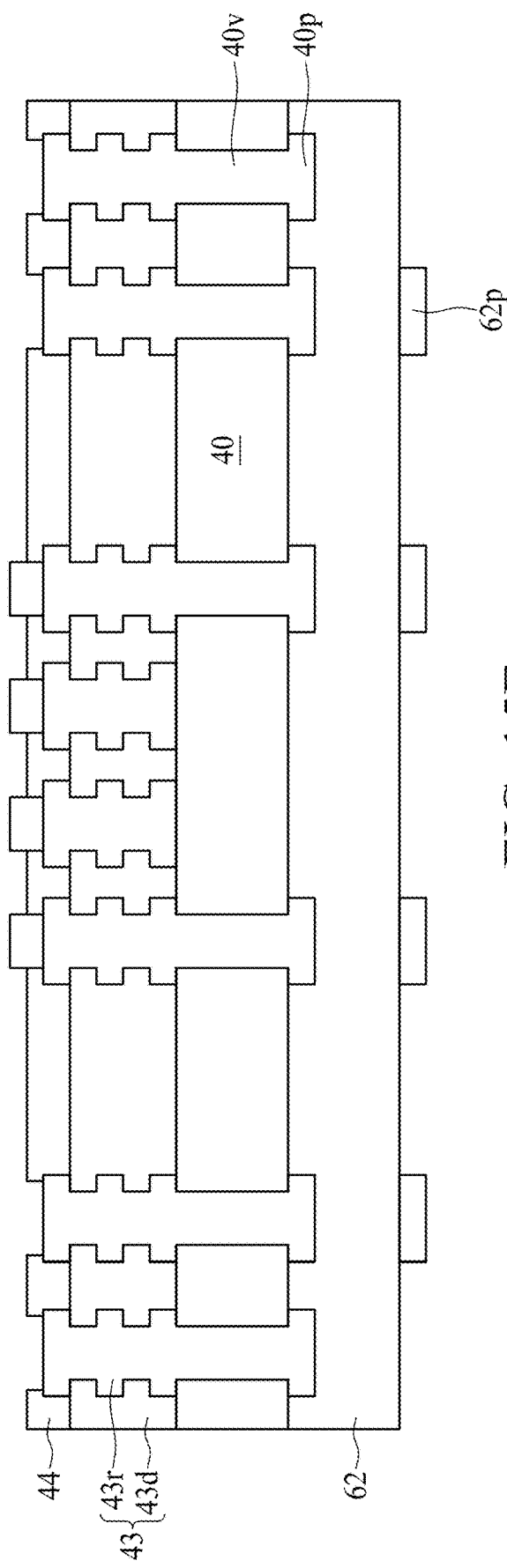

Referring to FIG. 15E, a conductive layer 62p is formed on a surface of the package body 62 facing away from the carrier 40. In some embodiments, the conductive layer 62p may define an antenna, such as a patch antenna. In some embodiments, the conductive layer 62p may be coupled to the conductive layer 40p for signal transmission therebetween.

Figure 15F:
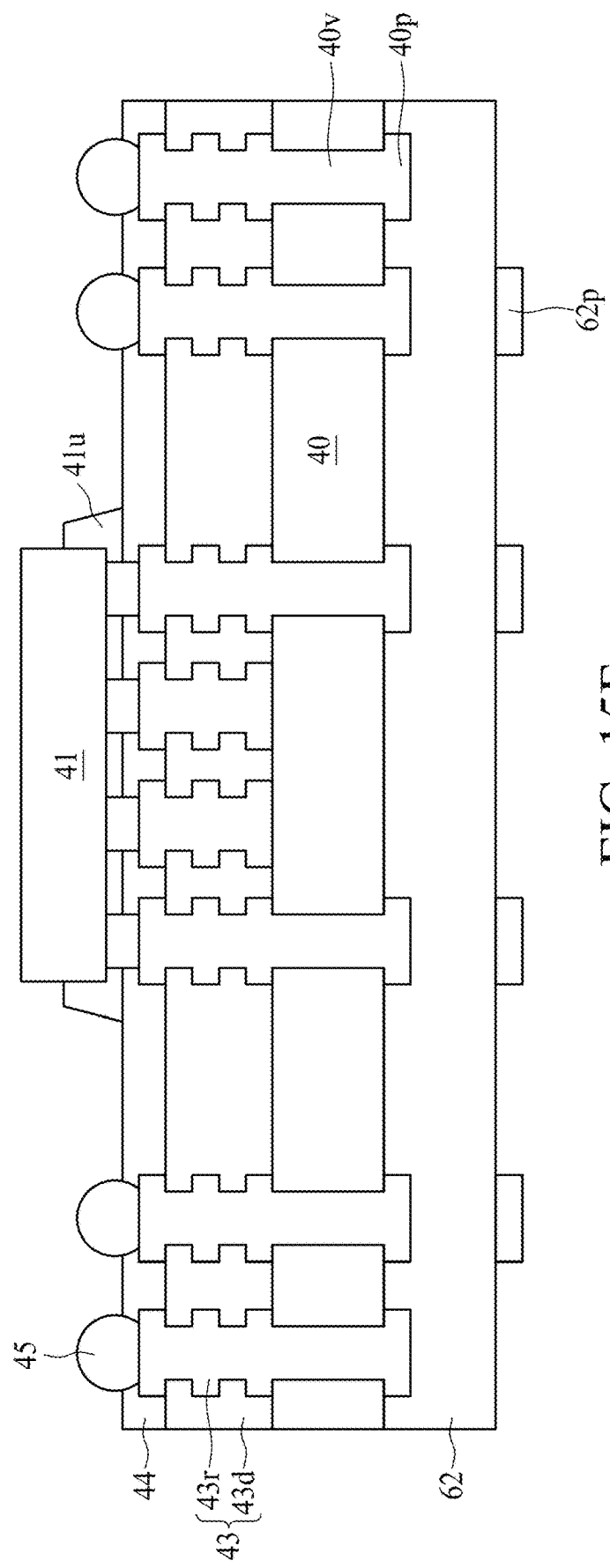

Referring to FIG. 15F, electrical contacts 45 are formed on the protection layer 44 and electrically connected to the interconnection layer 43r. The electronic component 41 is attached or bonded to the interconnection layer 43r. An underfill 41u is then formed between the electronic component 41 and the circuit layer 43 to form a semiconductor device package.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a carrier having a first side and a second side opposite to the first side;
an interconnection layer disposed over the first side of the carrier; and
a first antenna layer disposed under the second side of the carrier and electrically connected to the interconnection layer;
wherein the carrier includes a transparent material and the carrier is configured to facilitate an alignment between the first antenna layer and the interconnection layer.

2. The semiconductor device package of claim 1, wherein the carrier is a transparent glass.

3. The semiconductor device package of claim 1, wherein the first antenna layer has a left end and a right end, the left end of the first antenna layer is aligned with a left side of the interconnection layer, and the right end of the first antenna layer is aligned with a right side of the interconnection layer.

4. The semiconductor device package of claim 3, further comprising:
an electronic component disposed over the first side of the carrier, wherein the first antenna layer comprises at least two separated parts free from vertically overlapped with the electronic component.

5. The semiconductor device package of claim 1, wherein the first antenna layer comprises a plurality of antenna patterns,
wherein a first one of the antenna patterns has a first lateral side and a second lateral side opposite to the first lateral side,
wherein a second one of the antenna patterns is a closest one to the first lateral side of the first one of the antenna patterns,
wherein a third one of the antenna patterns is a closest one to the second lateral side of the first one of the antenna patterns,
wherein a pitch between the first one of the antenna patterns and the second one of the antenna patterns is less than a pitch between the first one of the antenna patterns and the third one of the antenna patterns.

6. The semiconductor device package of claim 1, further comprising:
a conductive element penetrating the carrier, wherein the interconnection layer is electrically connected to the first antenna layer through the conductive element.

7. The semiconductor device package of claim 6, further comprising:
an electronic component disposed over the first side of the carrier; and
a molding compound covering the first antenna layer, wherein the molding compound is physically spaced apart from the electronic component by the carrier.

8. The semiconductor device package of claim 7, further comprising:
a second antenna layer aligned with at least a portion of the first antenna layer, wherein the second antenna layer is coupled to the first antenna layer and configured for signal transmission.

9. The semiconductor device package of claim 6, further comprising:
an electronic component disposed over the first side of the carrier, wherein the conductive element vertically overlaps with the electronic component.

10. The semiconductor device package of claim 1, further comprising:
a molding compound disposed over the first side of the carrier;
an electronic component disposed over the first side of the carrier; and
a dielectric layer encapsulating the interconnection layer and covering the molding compound, and a material of the molding compound is different from a material of the dielectric layer,
and wherein the electronic component is physically spaced apart from the molding compound by the dielectric layer.

11. The semiconductor device package of claim 10, further comprising:
a shielding layer in contact with the carrier, wherein the shielding layer comprises a portion continuously extending from a first lateral surface to a second lateral surface of the electronic component.

12. A semiconductor device package, comprising:
a transparent carrier having a bottom surface, a top surface opposite to the bottom surface, and a first lateral surface extending between the top surface and the bottom surface;
a first antenna in contact with the transparent carrier; and
a dipole antenna in contact with the transparent carrier.

13. The semiconductor device package of claim 12, further comprising:
a second antenna disposed over the top surface of the transparent carrier, the first antenna is in contact with the bottom surface of the transparent carrier, and the dipole antenna is free from vertically overlapping the second antenna is a top view.

14. The semiconductor device package of claim 12, wherein the transparent carrier comprises a second lateral surface connected to the first lateral surface, and the dipole antenna is disposed adjacent to the first lateral surface and the second lateral surface of the transparent carrier.

15. The semiconductor device package of claim 14, further comprising:
a second antenna over the top surface of the transparent carrier, wherein the dipole antenna is around the second antenna.

16. The semiconductor device package of claim 14, wherein the transparent carrier comprises a third lateral surface opposite to the first lateral surface, and the dipole antenna is further disposed adjacent to the third lateral surface of the transparent carrier.

17. The semiconductor device package of claim 12, wherein the dipole antenna has an outermost lateral surface aligned with the first lateral surface of the transparent carrier.

18. The semiconductor device package of claim 17, further comprising:
a molding compound disposed over the top surface of the transparent carrier, wherein the outermost lateral surface of the dipole antenna is substantially aligned with an outermost lateral surface of the molding compound.

19. The semiconductor device package of claim 12, wherein each of the first antenna and the dipole antenna is disposed under the bottom surface of the transparent carrier.

20. The semiconductor device package of claim 19, further comprising:
a second antenna disposed over the top surface of the transparent carrier, and the second antenna is aligned with the first antenna.

* * * * *